United States Patent
Shinoda et al.

(10) Patent No.: US 10,558,127 B2
(45) Date of Patent: Feb. 11, 2020

(54) EXPOSURE CONDITION EVALUATION DEVICE

(71) Applicant: Hitachi High-Technologies Corporation, Minato-ku, Tokyo (JP)

(72) Inventors: Shinichi Shinoda, Tokyo (JP); Yasutaka Toyoda, Tokyo (JP); Hiroyuki Ushiba, Tokyo (JP); Hitoshi Sugahara, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 31 days.

(21) Appl. No.: 15/536,255

(22) PCT Filed: Dec. 18, 2015

(86) PCT No.: PCT/JP2015/085434
§ 371 (c)(1),
(2) Date: Jun. 15, 2017

(87) PCT Pub. No.: WO2016/104342
PCT Pub. Date: Jun. 30, 2016

(65) Prior Publication Data
US 2017/0336717 A1 Nov. 23, 2017

(30) Foreign Application Priority Data
Dec. 26, 2014 (JP) ................. 2014-263805

(51) Int. Cl.
*G03B 27/32* (2006.01)
*G03F 7/20* (2006.01)

(52) U.S. Cl.
CPC .......... *G03F 7/70483* (2013.01); *G03F 7/705* (2013.01); *G03F 7/7055* (2013.01); *G03F 7/70558* (2013.01); *G03F 7/70625* (2013.01)

(58) Field of Classification Search
CPC ............... G03F 7/7055; G03F 7/70483; G03F 7/70558; G03F 7/706; G03F 7/70616;
(Continued)

(56) References Cited

U.S. PATENT DOCUMENTS 6,159,644 A * 12/2000 Satoh .................. G03F 7/70433
430/22
6,873,938 B1 * 3/2005 Paxton ................ G03F 7/70558
438/33

(Continued)

FOREIGN PATENT DOCUMENTS

JP 4065817 B2 3/2008
JP 2013-74221 A 4/2013
(Continued)

OTHER PUBLICATIONS

International Search Report (PCT/ISA/210) issued in PCT Application No. PCT/JP2015/085434 dated Apr. 5, 2016 with English translation (5 pages).
(Continued)

*Primary Examiner* — Christina A Riddle
(74) *Attorney, Agent, or Firm* — Crowell & Morning LLP

(57) ABSTRACT

The purpose of the present invention is to provide an exposure condition evaluation device that appropriately evaluates a wafer exposure condition or calculates an appropriate exposure condition, on the basis of information obtained from an FEM wafer, without relying on the formation state of the FEM wafer. In order to achieve the foregoing, the present invention proposes an exposure condition evaluation device which evaluates an exposure condition of a reduction projection exposure device, on the basis of the information of patterns exposed on a sample by the reduction projection exposure device, and which uses a second feature amount of a plurality of patterns formed by making exposure conditions uniform to correct a first feature (Continued)

amount of a plurality of patterns formed by a plurality of different exposure condition settings.

18 Claims, 23 Drawing Sheets

(58) Field of Classification Search
CPC .............. G03F 7/70625; G03F 7/70666; G03F 7/70675; G03F 7/70683; G03F 7/70491–70541
USPC .... 355/52, 53, 55, 67–77; 250/492.1, 492.2, 250/492.22, 493.1, 548; 430/5, 8, 22, 30, 430/311, 312, 321, 322
See application file for complete search history.

(56) References Cited

U.S. PATENT DOCUMENTS

| | | |
|---|---|---|
| 6,929,892 B2 | 8/2005 | Shishido et al. |
| 2012/0151428 A1* | 6/2012 | Tanaka ................... G01B 15/04 716/112 |
| 2012/0156810 A1 | 6/2012 | Fukazawa |
| 2013/0150998 A1* | 6/2013 | Matsuoka ................ G03F 1/70 700/121 |
| 2014/0185918 A1 | 7/2014 | Hirai et al. |
| 2015/0287201 A1 | 10/2015 | Shinoda et al. |
| 2015/0356726 A1* | 12/2015 | Fukazawa ............ G01N 21/956 382/149 |

FOREIGN PATENT DOCUMENTS

| | | |
|---|---|---|
| WO | WO 2012/081587 A1 | 6/2012 |
| WO | WO 2013/122022 A1 | 8/2013 |
| WO | WO 2014/104194 A1 | 7/2014 |

OTHER PUBLICATIONS

Japanese-language Written Opinion (PCT/ISA/237) issued in PCT Application No. PCT/JP2015/085434 dated Apr. 5, 2016 (4 pages).

* cited by examiner

[Fig. 1]
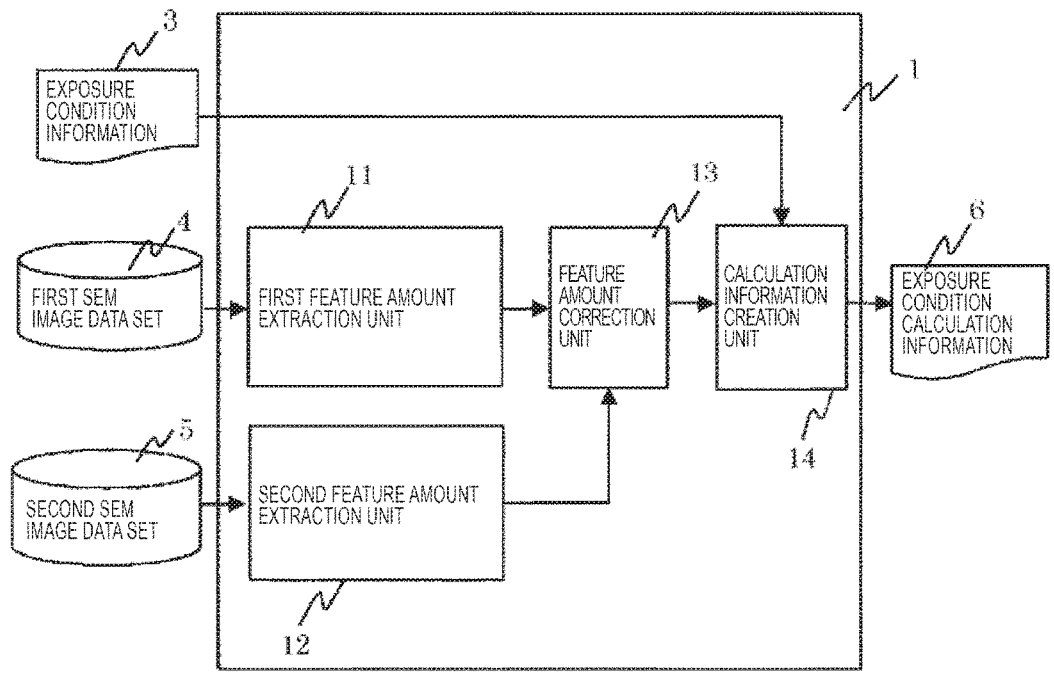
[Fig. 2]
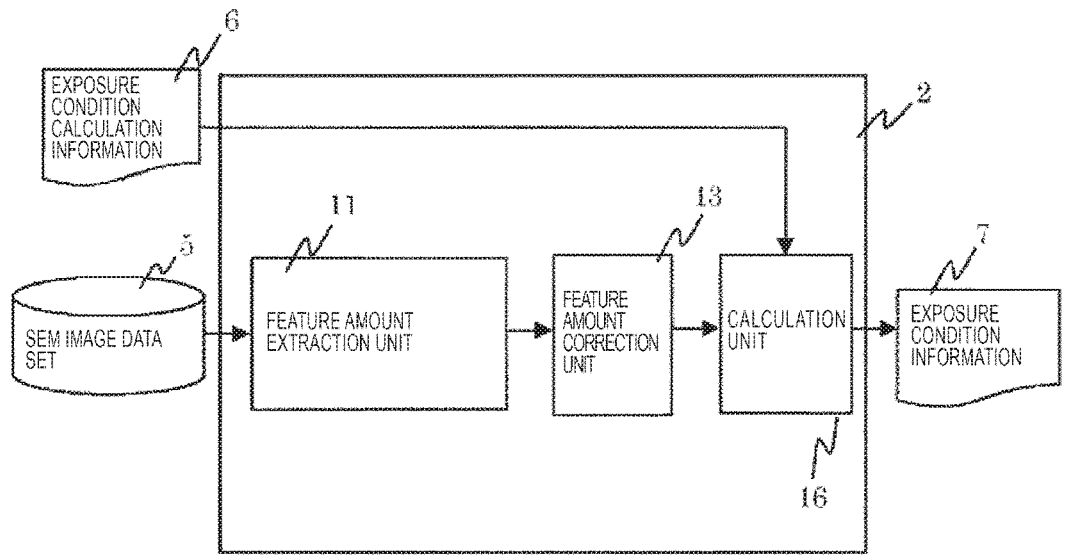

[Fig. 3]
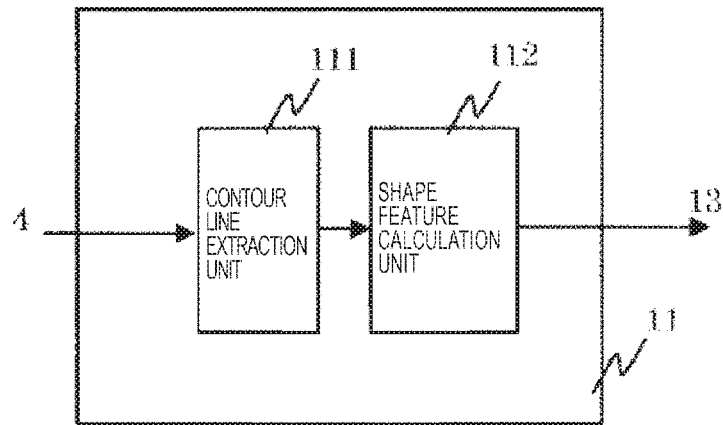
[Fig. 4]
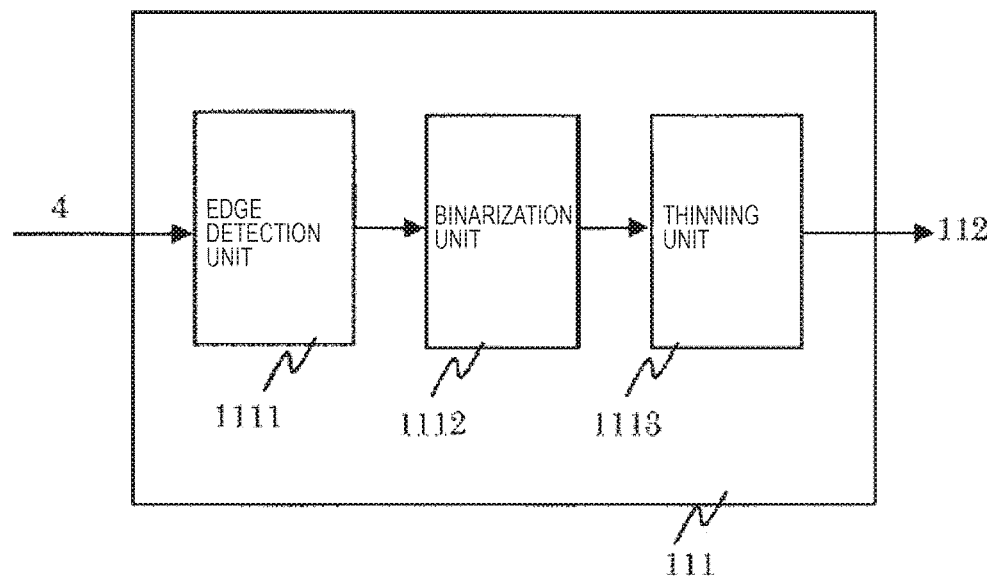

[Fig. 5]
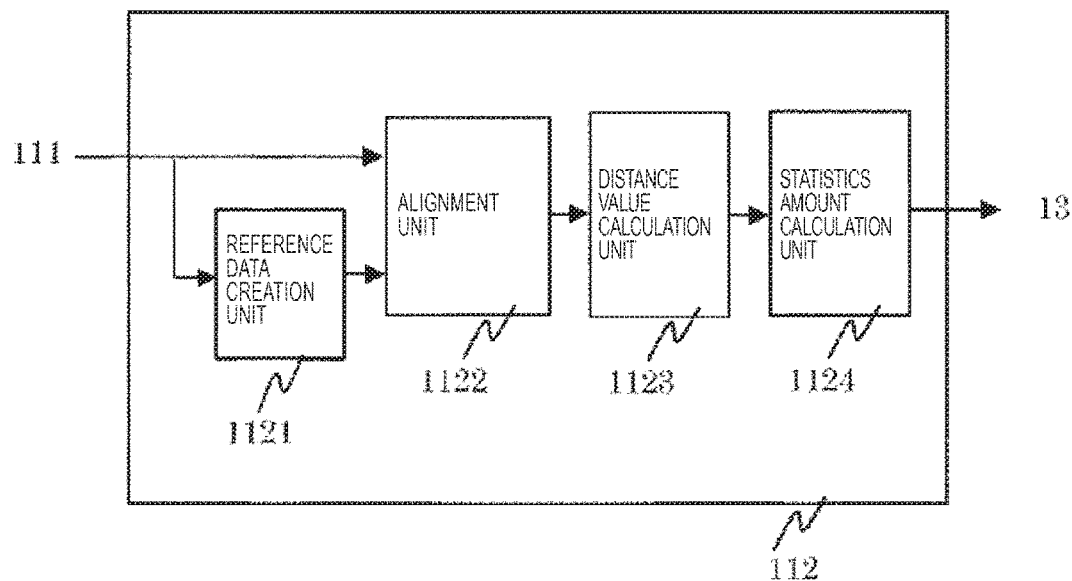
[Fig. 6]
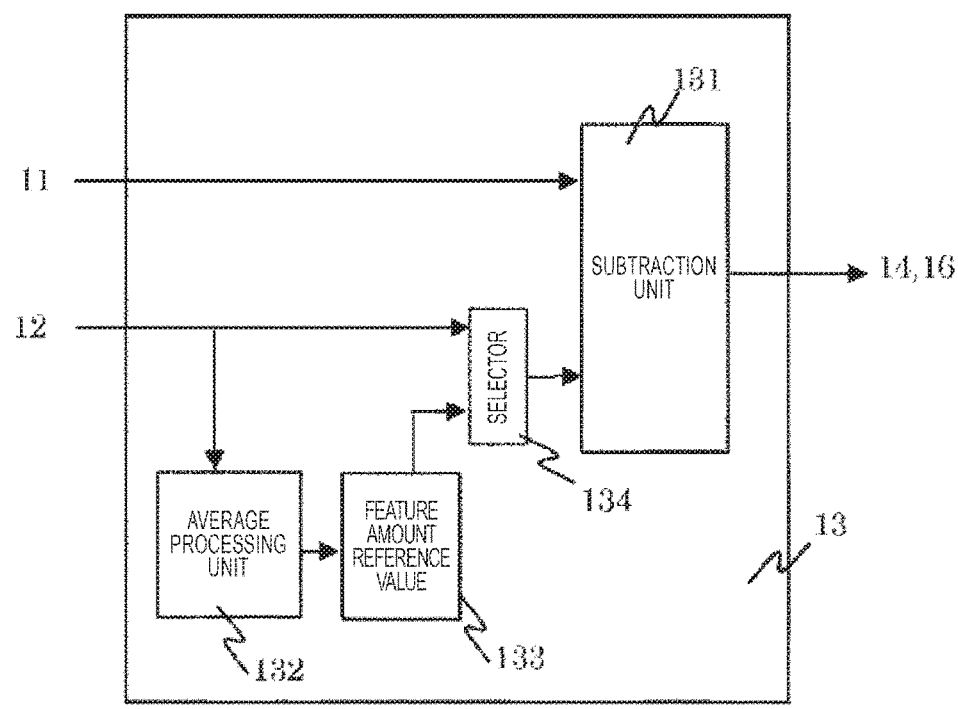

[Fig. 7]
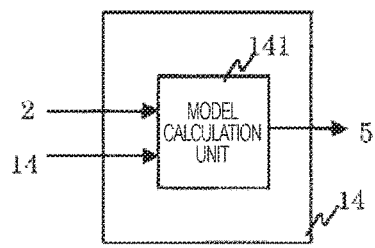
[Fig. 8]
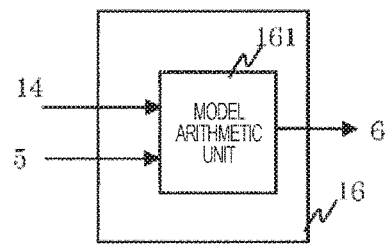
[Fig. 9]
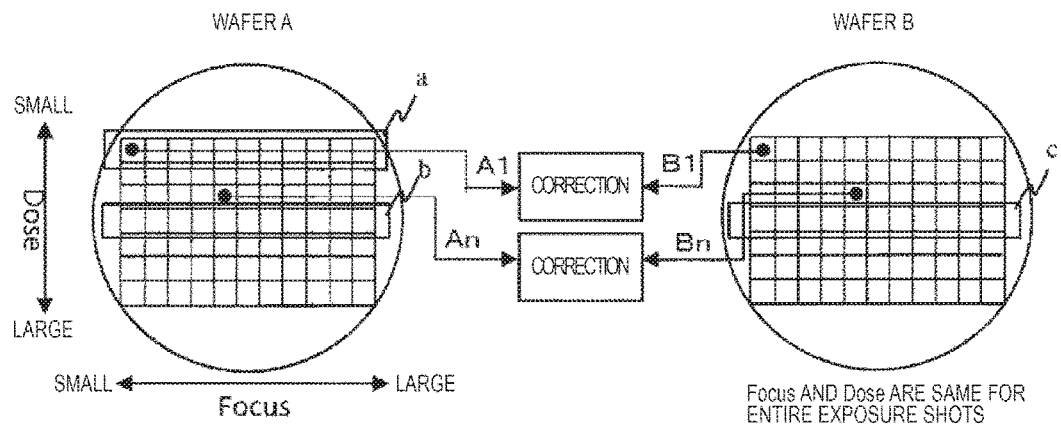

[Fig. 10]
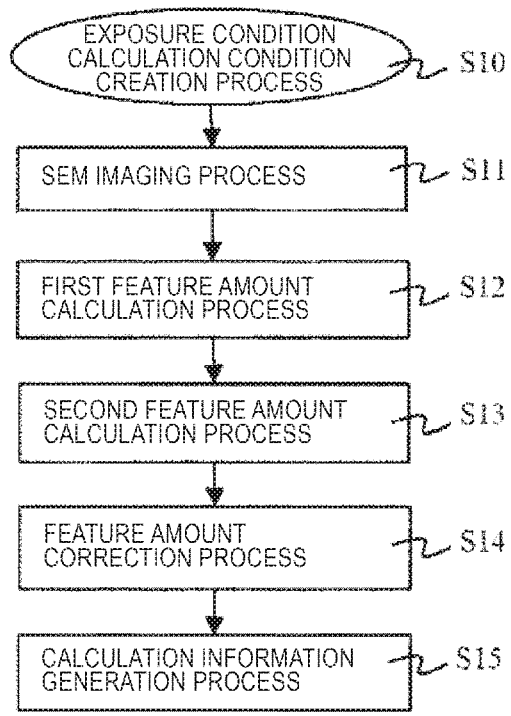
[Fig. 11]
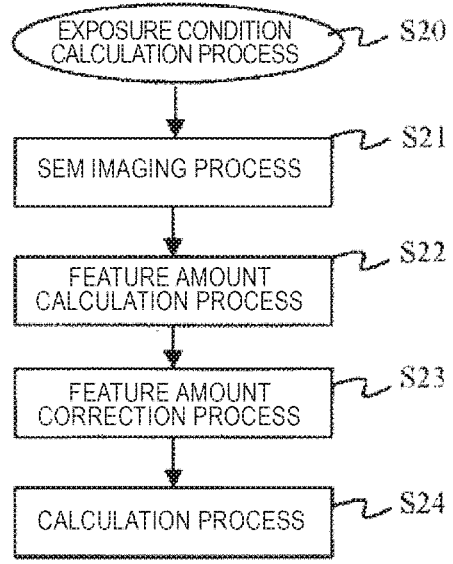

[Fig. 13]
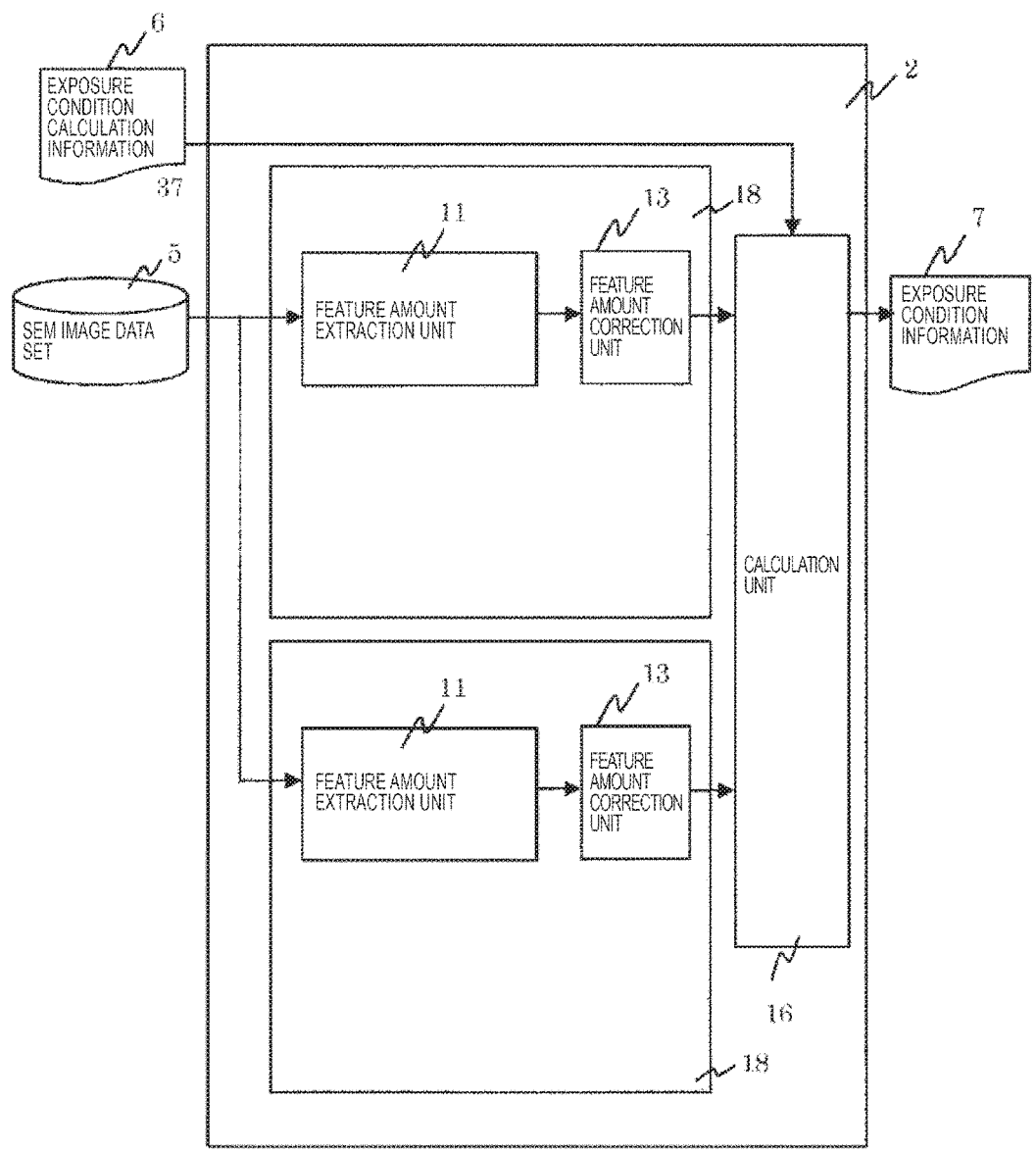

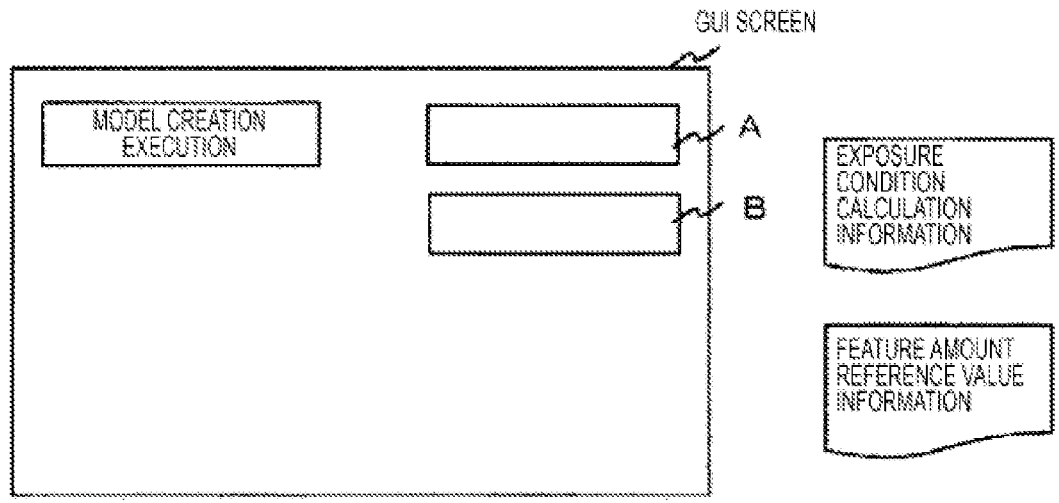
Fig. 14A            Fig. 14B
Fig. 15
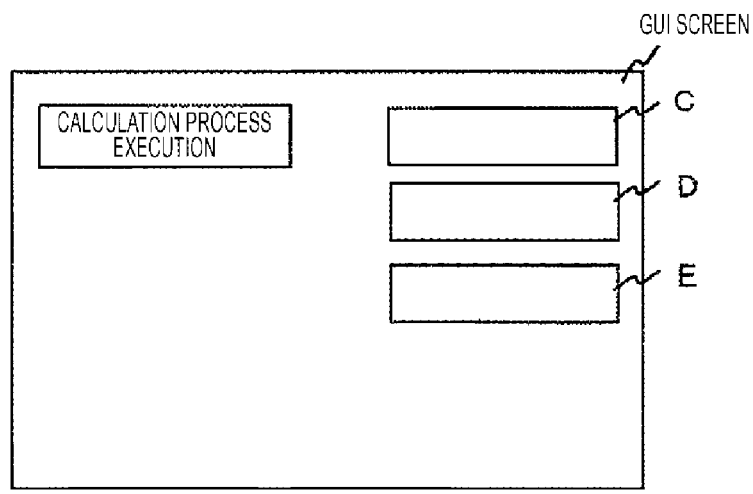

[Fig. 16]
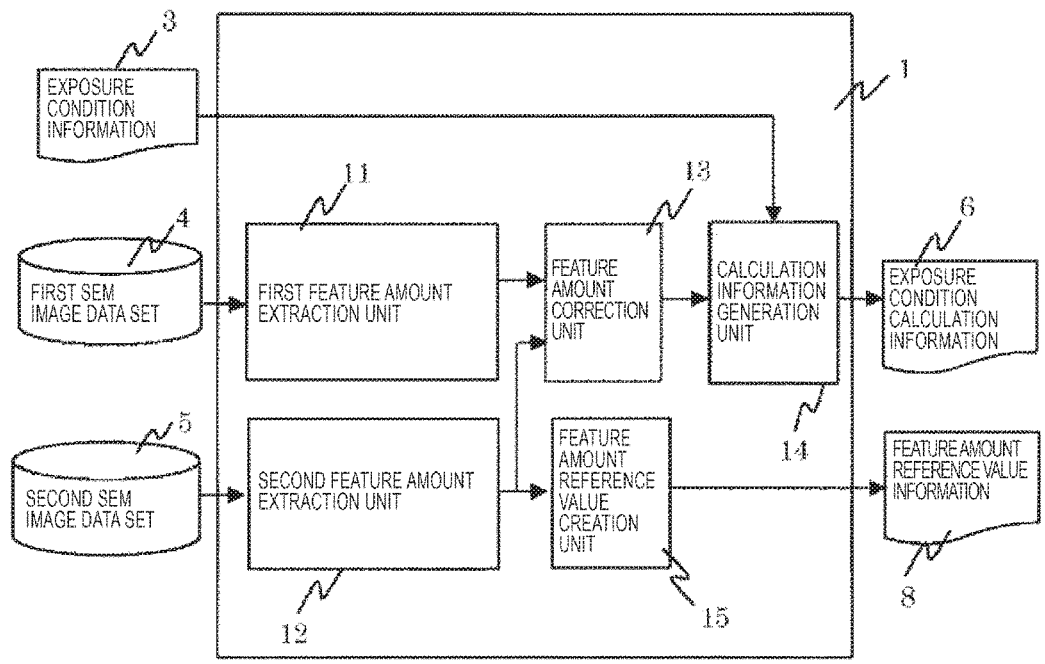
[Fig. 17]
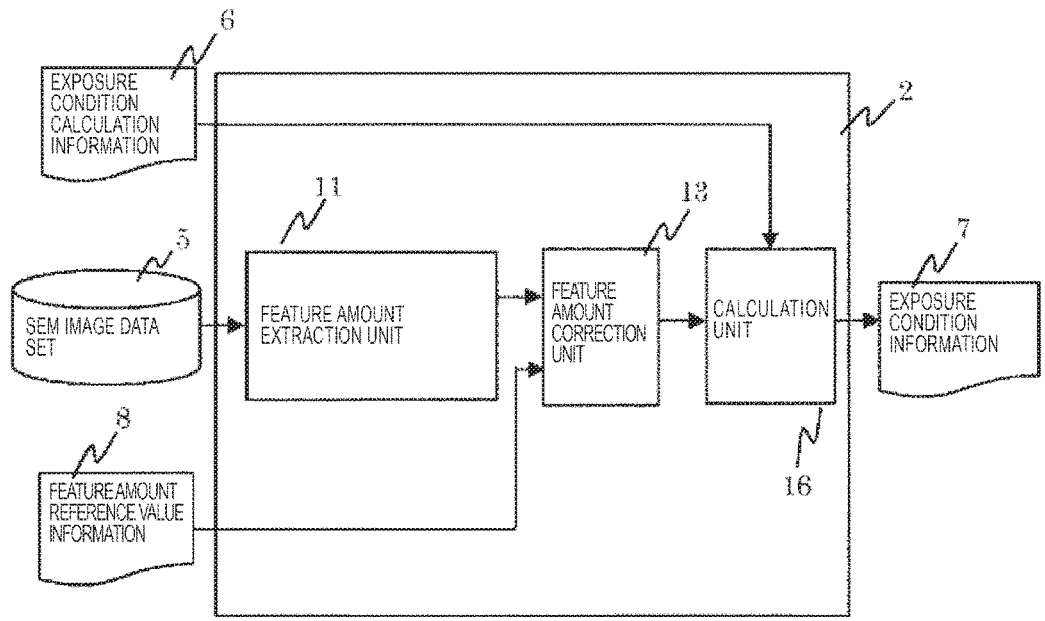

[Fig. 18]
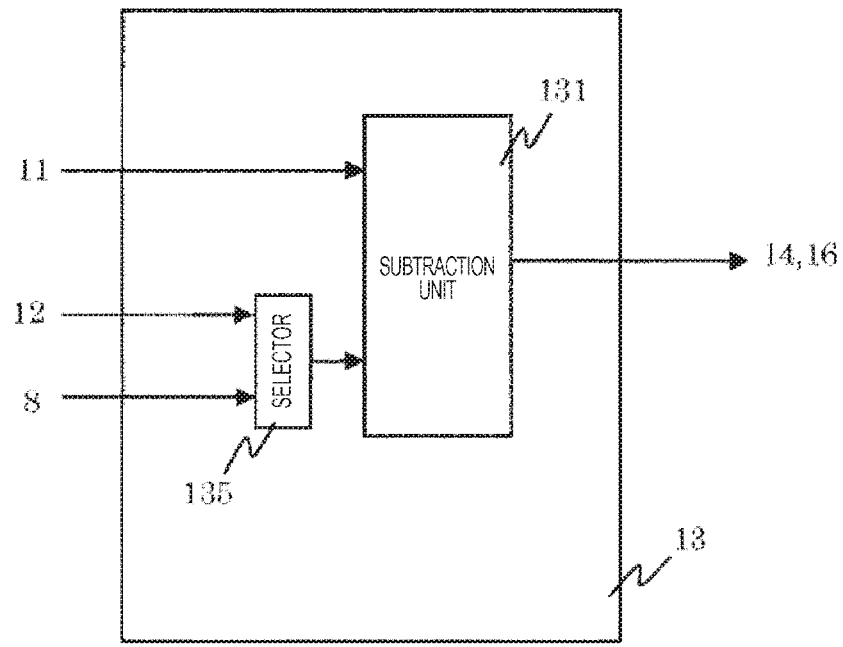
[Fig. 19]
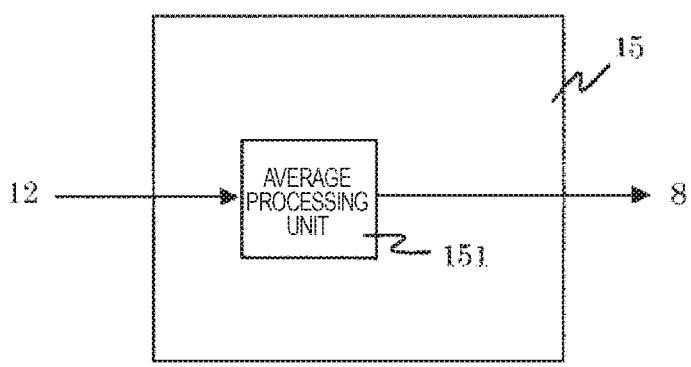

[Fig. 20]
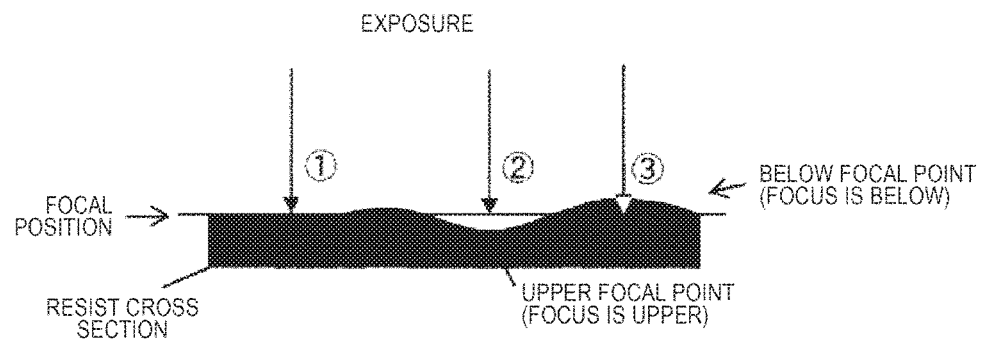
[Fig. 21]
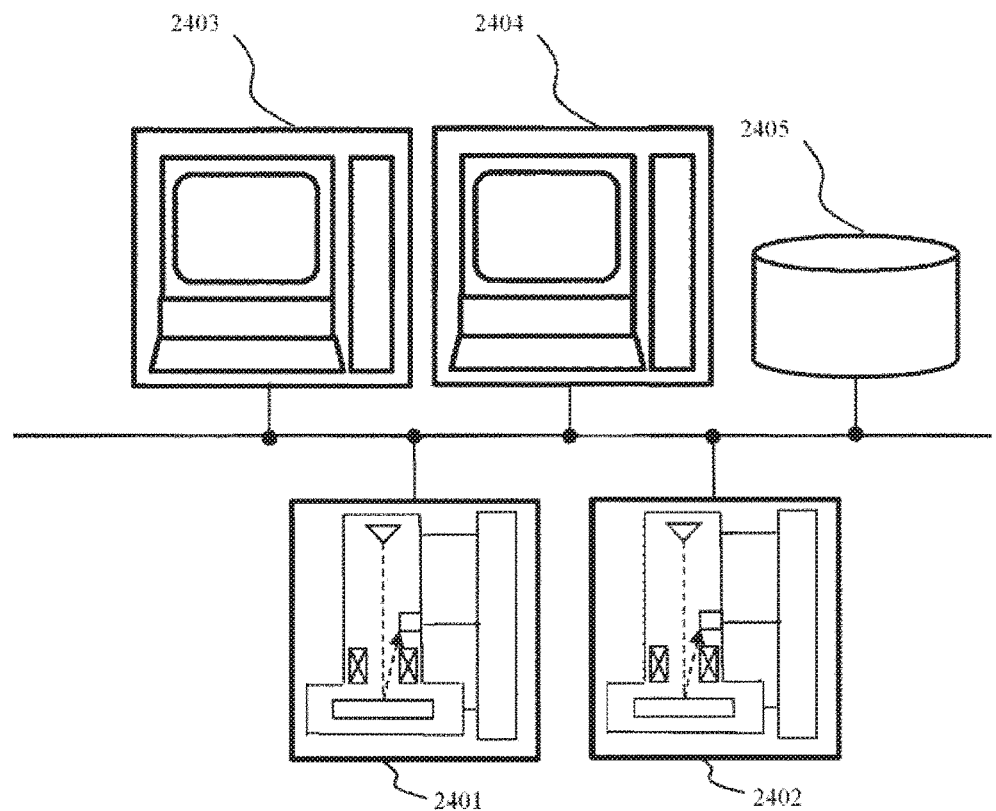

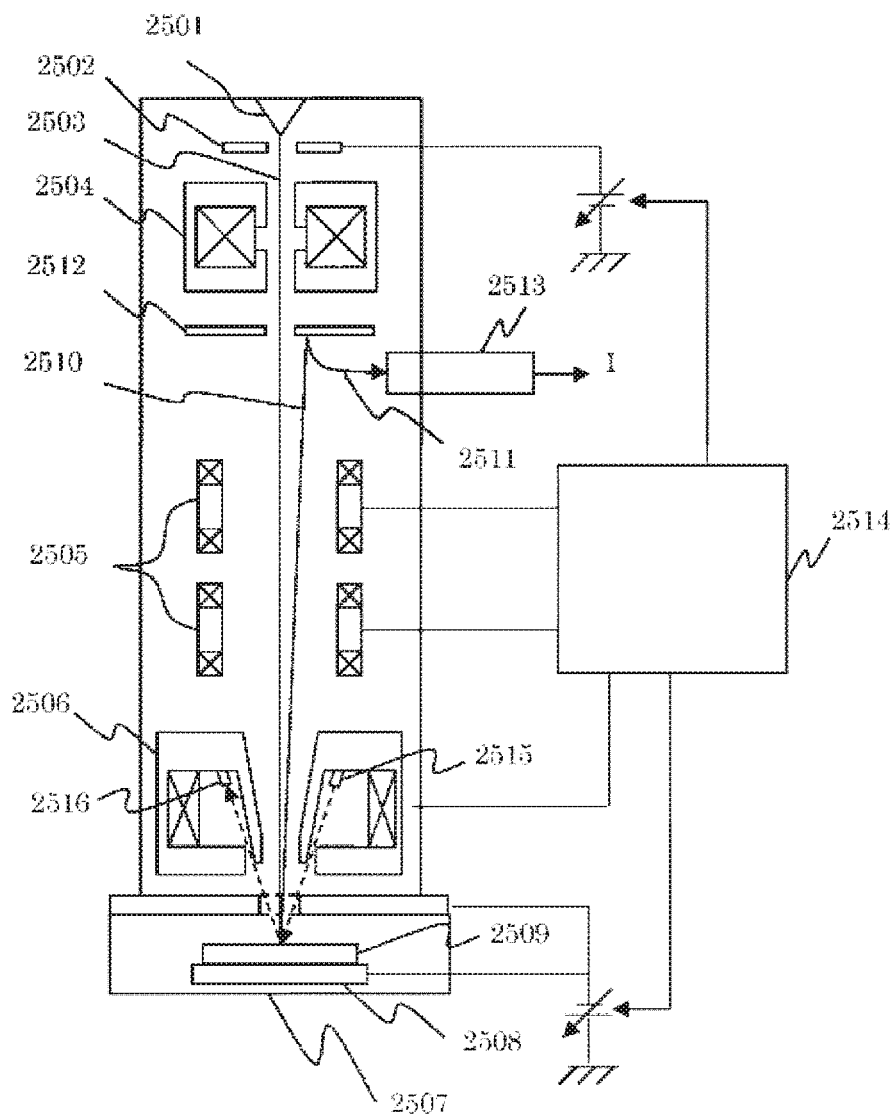
[Fig. 22]

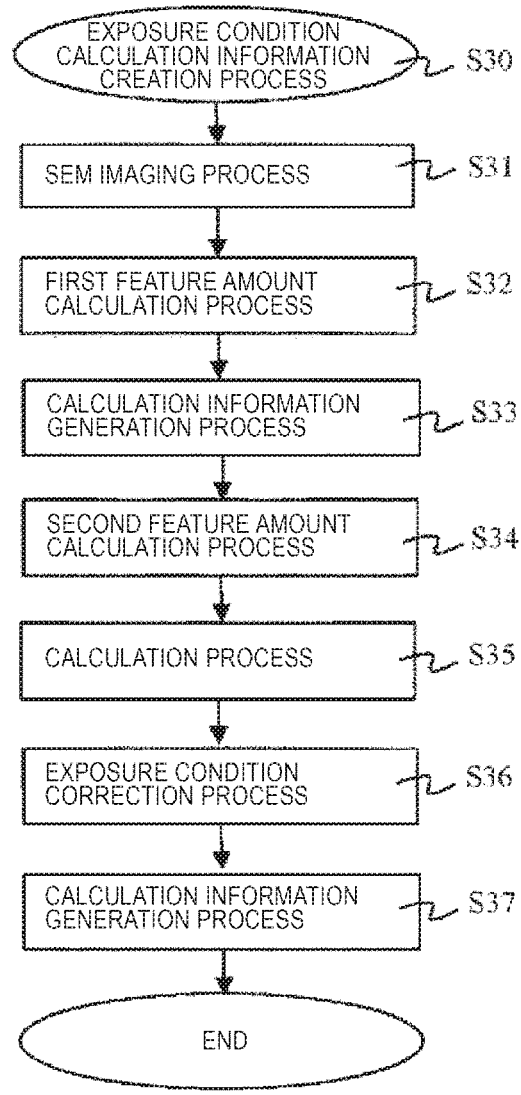
[Fig. 23]

[Fig. 24]
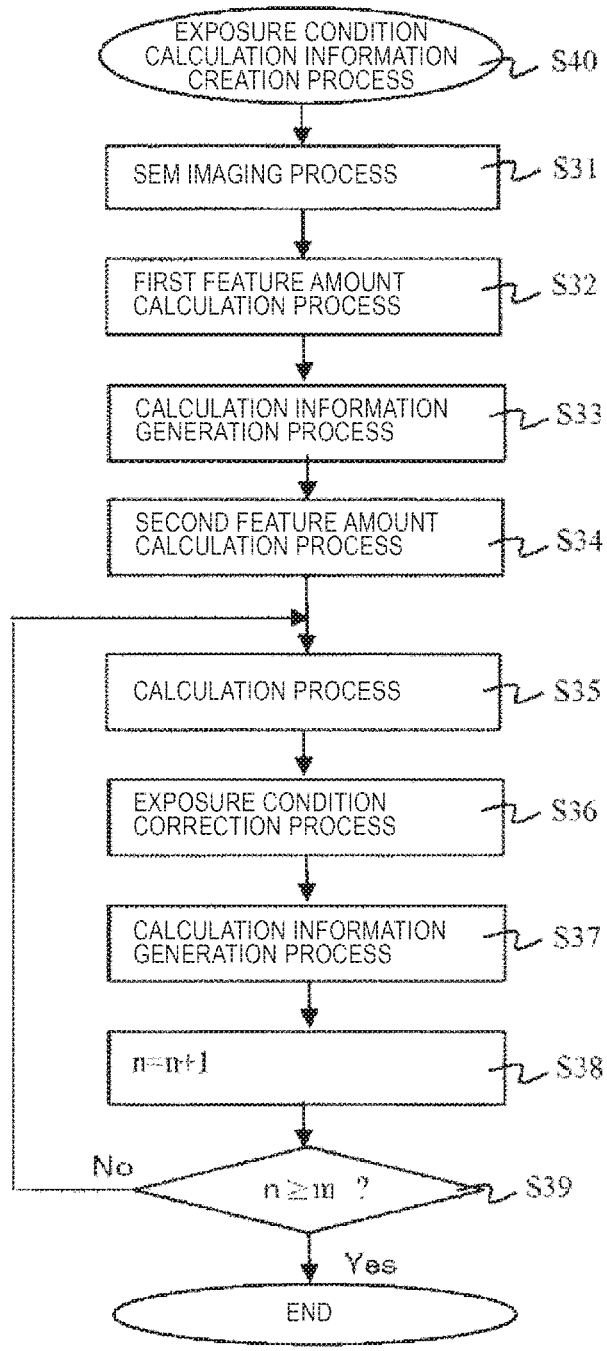

[Fig. 25]
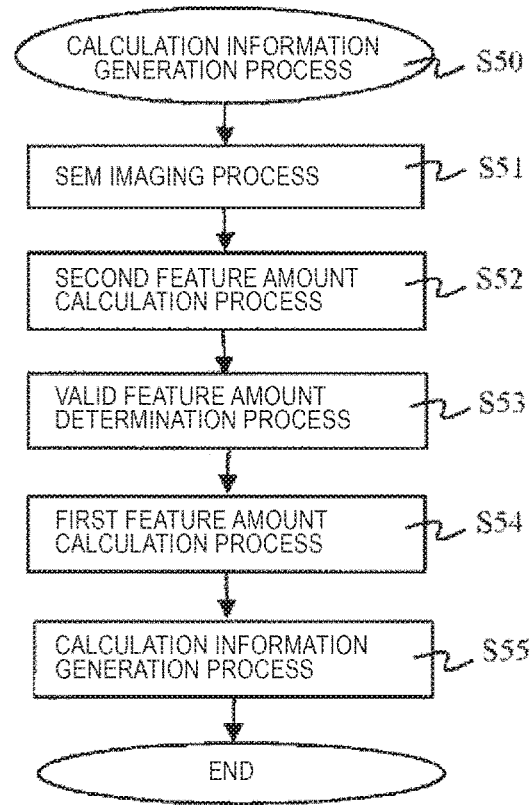
[Fig. 26]
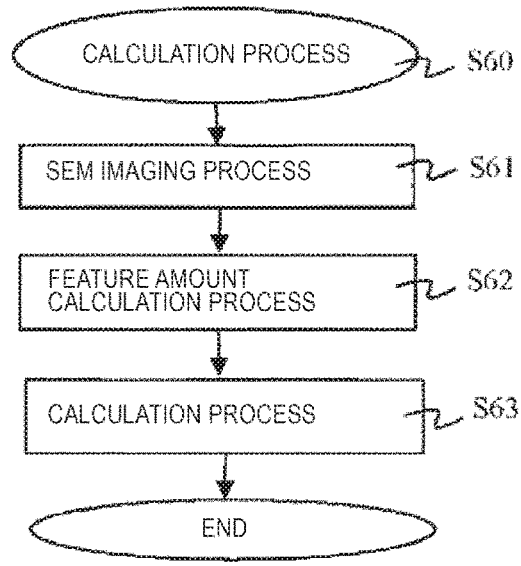

[Fig. 27]
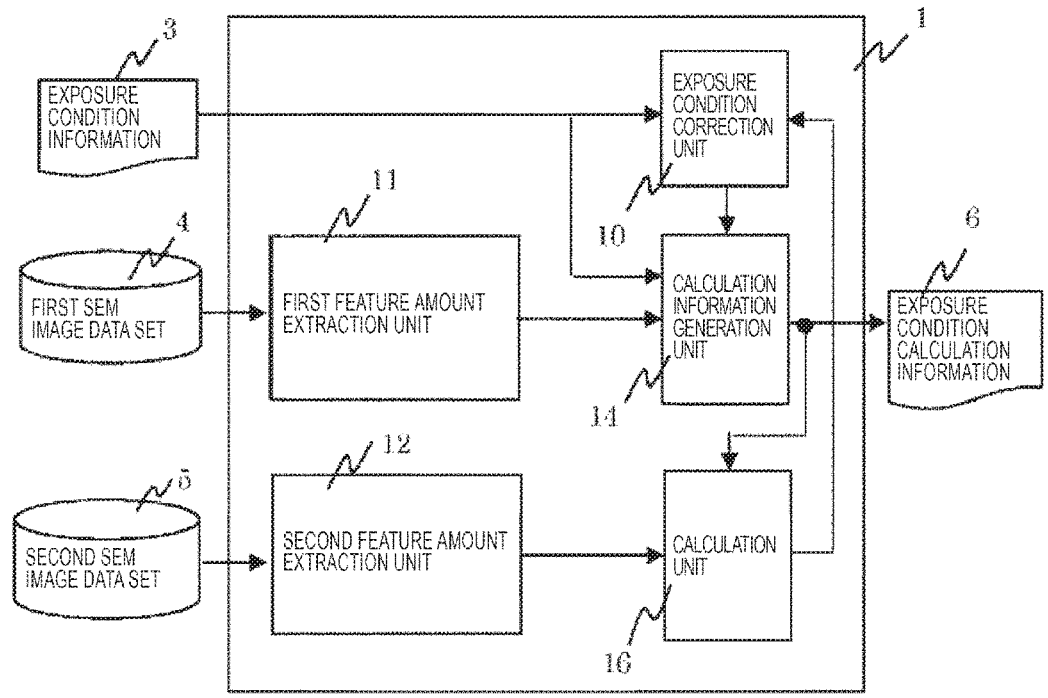
[Fig. 28]
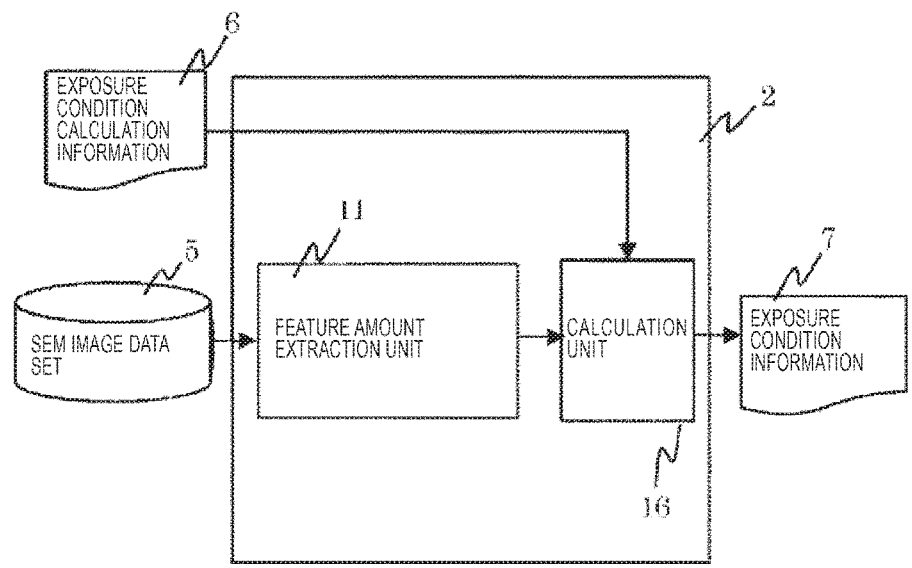

[Fig. 29]
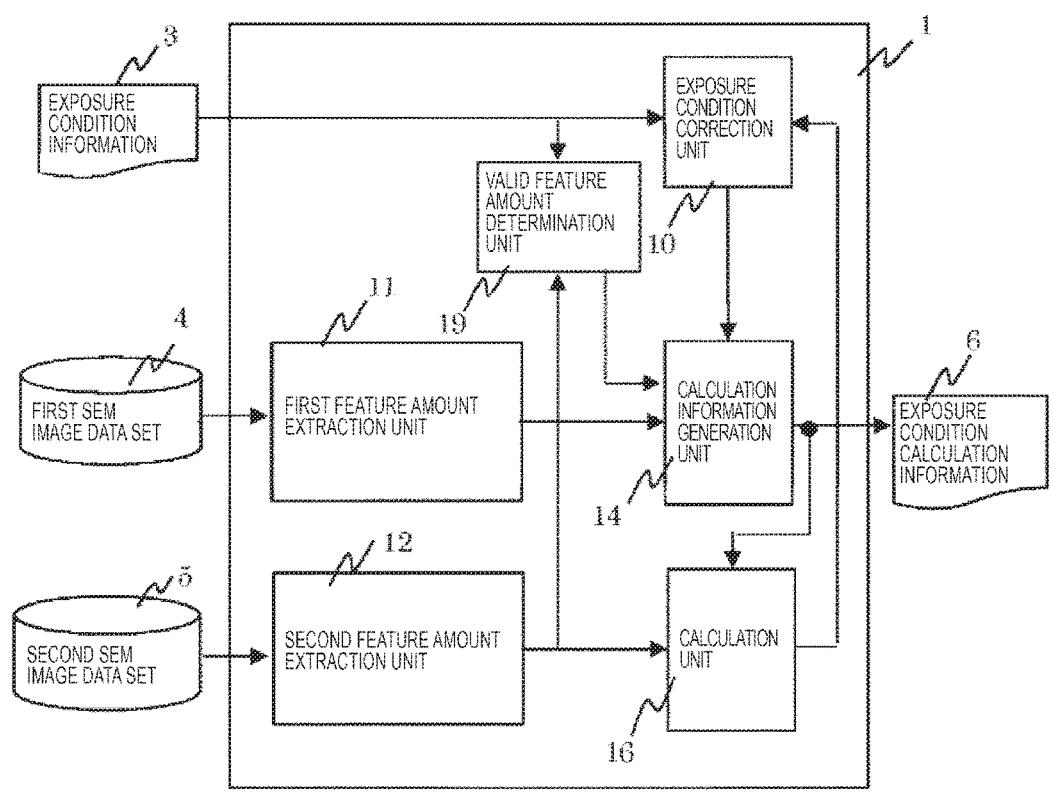

[Fig. 30]
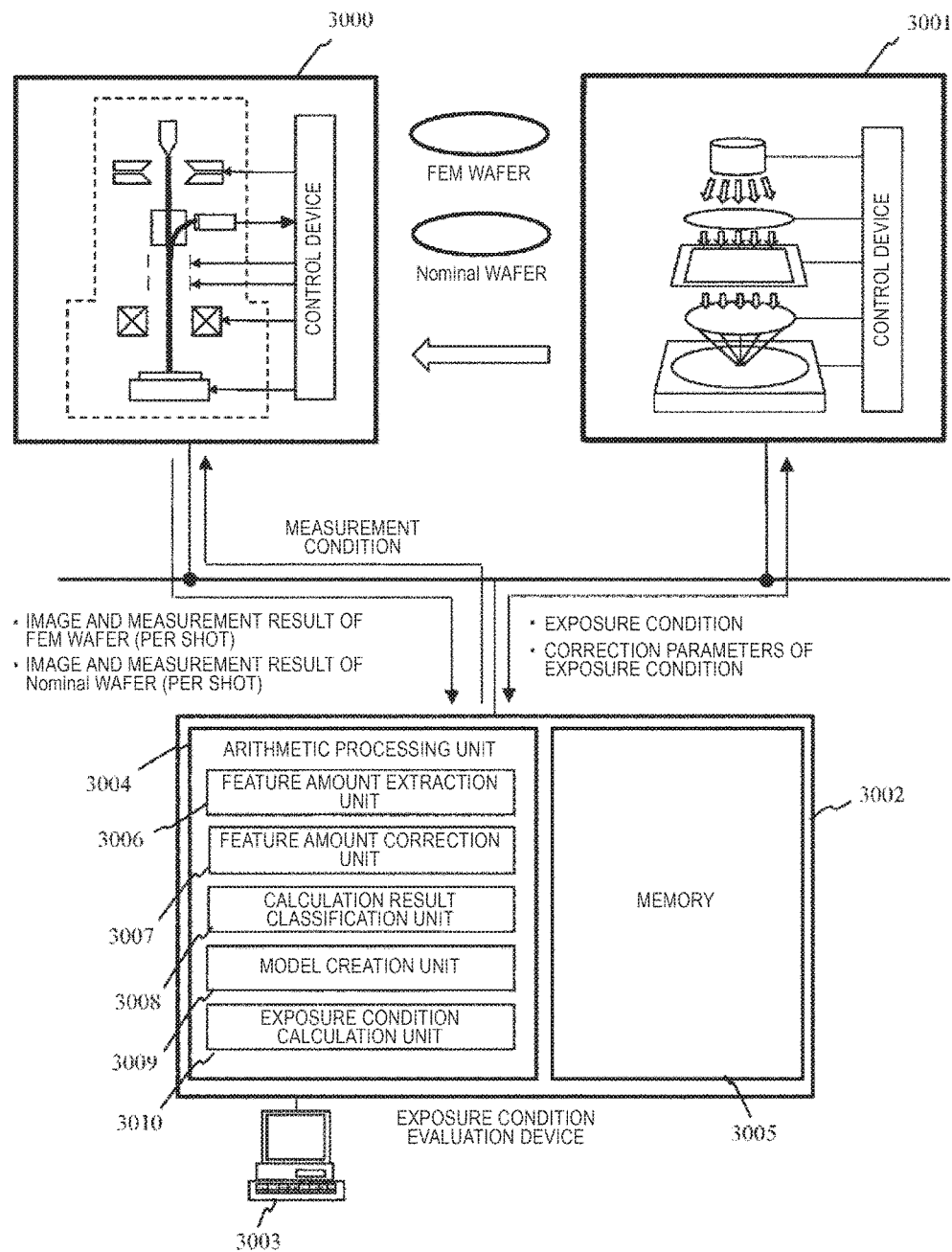

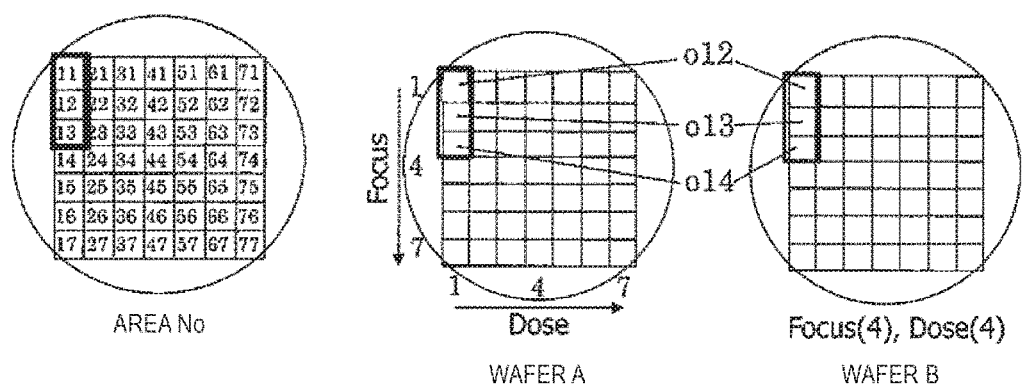

[Fig. 32]
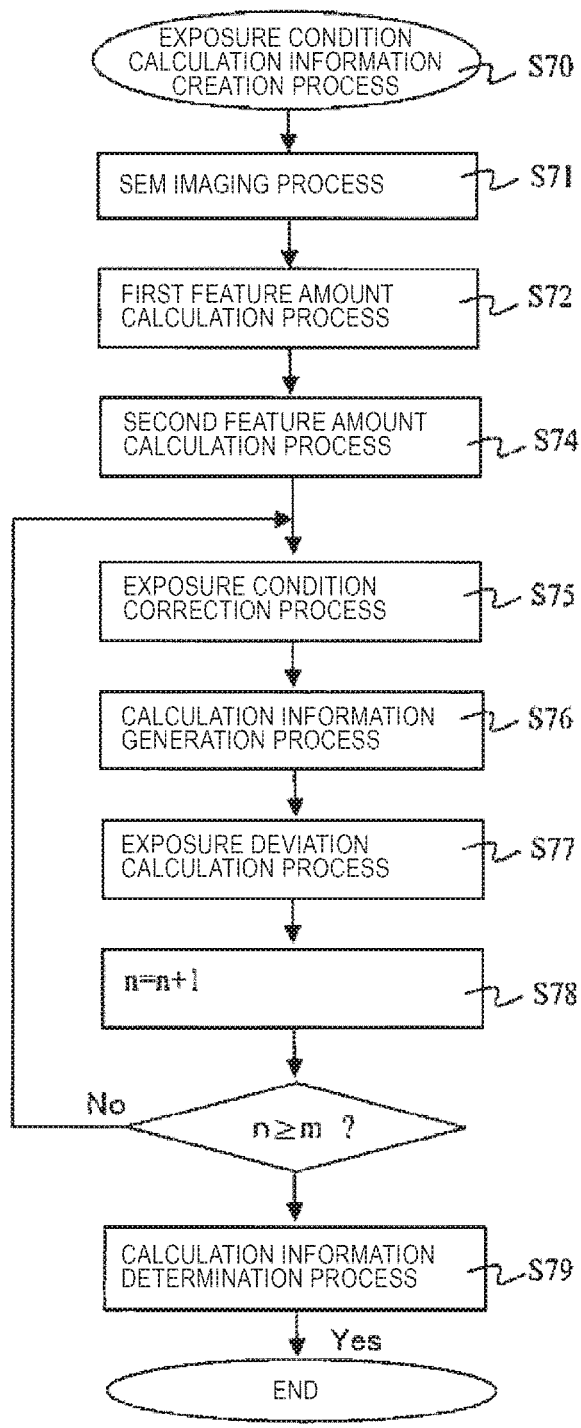

[Fig. 33]
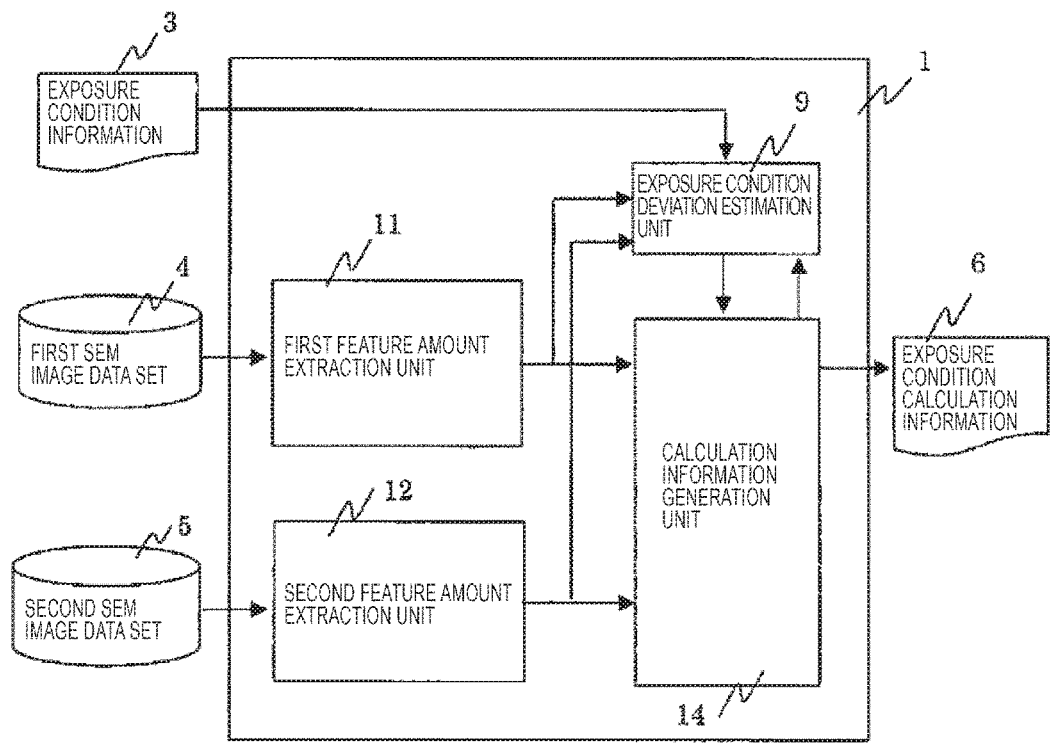
[Fig. 34]
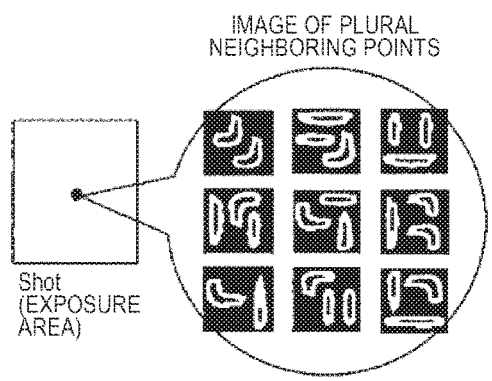

[Fig. 35]
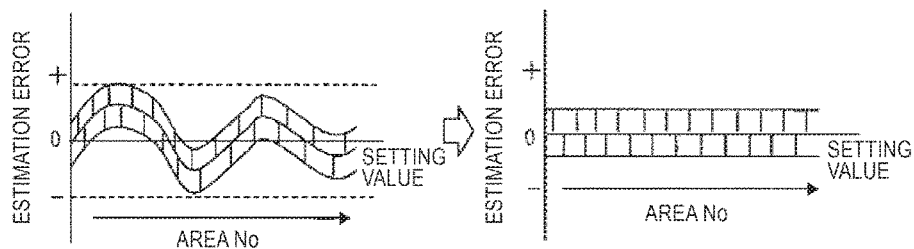
[Fig. 36]
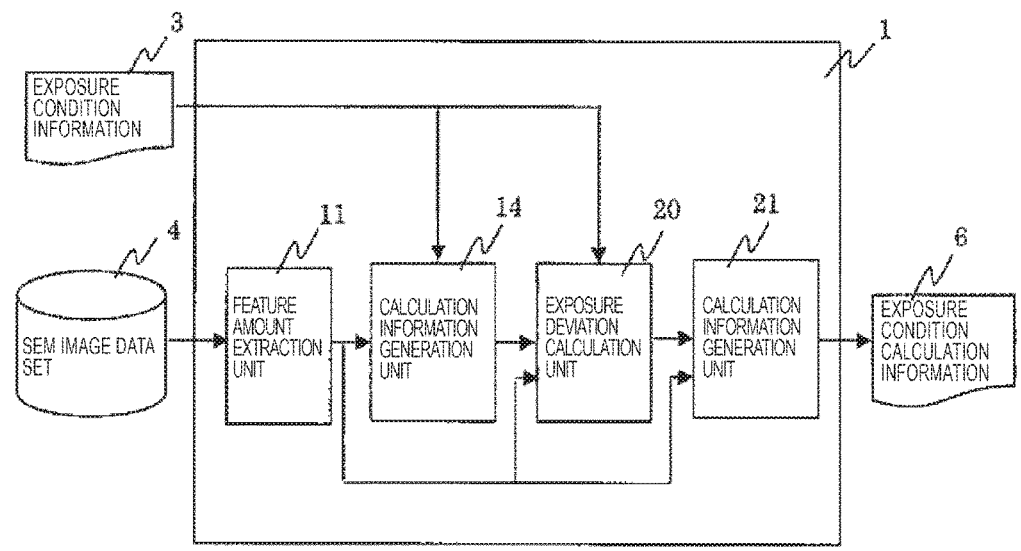

[Fig. 37]
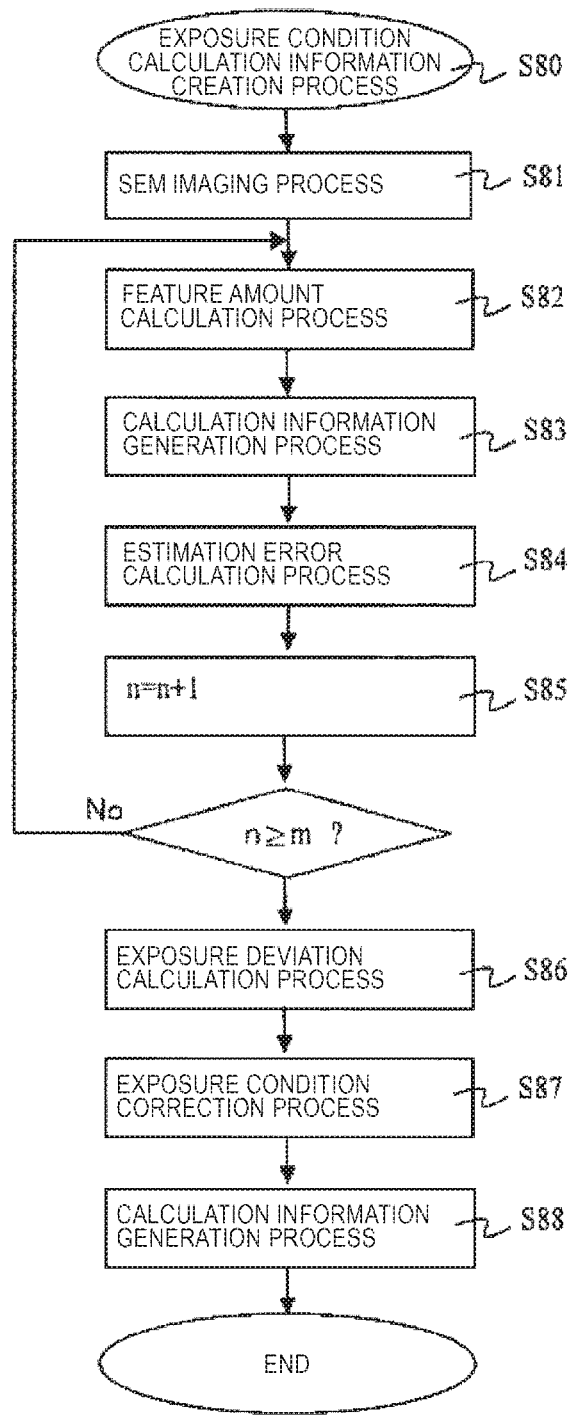

EXPOSURE CONDITION EVALUATION DEVICE

TECHNICAL FIELD

The present invention relates to an exposure condition evaluation device such as a reduction projection exposure device, and more particularly to an exposure condition evaluation device that evaluates an exposure condition of a reduction projection exposure device on the basis of information obtained from a conditioning wafer.

BACKGROUND ART

These days, in a semiconductor process, as a means for evaluating whether or not a formed pattern is as designed, the shape of the pattern is managed with dimensions by measuring the width of a line pattern or the size of the diameter of a hole by using a critical dimension-scanning electron microscope (CD-SEM), and in recent years, strict dimension control is necessary along with the miniaturization of semiconductors.

In a projection exposure method of transferring a semiconductor circuit pattern onto a wafer, exposure light is applied to the photomask of a shielding material in which the circuit pattern to be printed is written and the image of the photomask is projected onto a resist on the wafer through a lens system to create a circuit pattern. One chip or a plurality of chips are printed with one exposure shot, and a circuit pattern is formed on the wafer with a plurality of exposure shots.

When exposing with an exposure device, exposure is performed by appropriately determine a focus and an exposure amount, which is an exposure condition. However, even if exposure is performed by uniformly determining the focus and the exposure amount to appropriate values, there is a problem that a normal circuit pattern is not created or the variation in dimensions of the pattern becomes large because the values of the focus and the exposure amount deviate from the appropriate values by roughness on the surface of the resist due to uneven resist coating, non-flatness due to the photomask, aberration of the lens, and the like.

The deviation of the exposure condition caused by resist coating, photomask, and lens aberration is reproducible. A method of measuring the shape of a circuit pattern on a Focus Exposure Matrix (FEM) wafer created in advance under a plurality of exposure conditions by changing the exposure condition with the semiconductor measurement device and evaluating a relationship between the exposure condition and the circuit pattern shape to estimate the exposure condition from the circuit pattern shape measured by a semiconductor measurement device is known (see PTL 1). By feeding back exposure parameters estimated by this method to an exposure machine, it is possible to perform exposure in which the deviation of the exposure condition is corrected.

CITATION LIST

Patent Literature

PTL 1: Japanese Patent No. 4065817 (corresponding U.S. Pat. No. 6,929,892)

SUMMARY OF INVENTION

Technical Problem

As described above, an FEM wafer is a wafer used for conditioning an exposure condition of a reduction projection exposure device, and further used for grasping what kind of exposure condition the wafer as a measurement target is exposed to by modeling a relationship between the exposure condition and the shape information of a pattern on the basis of the measurement result obtained by measurement using a CD-SEM or the like. As described above, an FEM wafer serves as a reference for evaluating an exposure condition. If the FEM wafer is not properly formed, appropriate exposure condition evaluation as described above cannot be performed. For example, if an FEM wafer itself has uneven resist coating or the like, an exposure condition changes accordingly, making it difficult to create an appropriate FEM wafer reflecting the change in the exposure condition. In PTL 1, a state in which an FEM wafer serving as a reference for evaluation is not appropriately formed is not assumed.

Hereinafter, an exposure condition evaluation device with a purpose of appropriately evaluating a wafer exposure condition or calculating an appropriate exposure condition, on the basis of information obtained from an FEM wafer, without relying on the formation state of the FEM wafer will be described.

Solution to Problem

As one aspect of the embodiment for achieving the above purpose, hereinafter, there is provided an exposure condition evaluation device including an arithmetic device that evaluates an exposure condition of a reduction projection exposure device, on the basis of information of patterns exposed on a sample by the reduction projection exposure device, in which the arithmetic device corrects a first feature amount of a plurality of patterns formed by a plurality of different exposure condition settings by using a second feature amount of a plurality of patterns formed by making exposure conditions uniform.

As another aspect of the embodiment for achieving the above purpose, hereinafter, there is provided an exposure condition evaluation device including an arithmetic device which evaluates an exposure condition of a reduction projection exposure device, on the basis of information of patterns exposed on a sample by the reduction projection exposure device, in which the arithmetic device creates association information between a first feature amount of a plurality of patterns formed by a plurality of different first exposure condition settings and the exposure conditions of the plurality of patterns, calculates a second exposure condition on the basis of the association information and a second feature amount of a plurality of patterns formed by making exposure conditions uniform, and corrects the first exposure condition by using the calculated second exposure condition.

Advantageous Effects of Invention

According to the above configuration, it is possible to appropriately evaluate a wafer exposure condition or calculate an appropriate exposure condition, on the basis of information obtained from an FEM wafer, without relying on the formation state of the FEM wafer.

BRIEF DESCRIPTION OF DRAWINGS

FIG. 1 is a diagram showing an example of a semiconductor measurement device.

FIG. 2 is a diagram showing the example of the semiconductor measurement device.

FIG. 3 is a diagram showing the example of a feature amount extraction unit.

FIG. 4 is a diagram showing the example of a contour line extraction unit.

FIG. 5 is a diagram showing the example of shape feature calculation.

FIG. 6 is a diagram showing the example of a feature amount correction unit.

FIG. 7 is a diagram showing the example of a calculation information generation unit.

FIG. 8 is a diagram showing the example of a calculation unit.

FIG. 9 is a diagram showing the example of a wafer used in an exposure condition calculation information creation unit.

FIG. 10 is a diagram showing the example of a process flow of the exposure condition calculation information creation unit.

FIG. 11 is a diagram showing the example of a process flow of an exposure condition calculation unit.

FIG. 13 is a diagram showing the example of the semiconductor measurement device.

FIGS. 14A and 14B are diagrams showing the examples of a GUI screen of the semiconductor measurement device.

FIG. 15 is a diagram showing the example of a GUI screen of the semiconductor measurement device.

FIG. 16 is a diagram showing the example of the semiconductor measurement device.

FIG. 17 is a diagram showing the example of the semiconductor measurement device.

FIG. 18 is a diagram showing the example of the feature amount correction unit.

FIG. 19 is a diagram showing the example of a feature amount reference value creation unit.

FIG. 20 is a diagram for explaining a resist cross section and a focal position.

FIG. 21 is a diagram showing an example of a semiconductor measurement system.

FIG. 22 is a schematic diagram explaining a scanning electron microscope.

FIG. 23 is a diagram showing the example of a process flow of the semiconductor measurement device.

FIG. 24 is a diagram showing the example of a process flow of the semiconductor measurement device.

FIG. 25 is a diagram showing the example of a process flow of a calculation information generation process.

FIG. 26 is a diagram showing the example of a calculation process flow.

FIG. 27 is a diagram showing the example of the semiconductor measurement device.

FIG. 28 is a diagram showing the example of the semiconductor measurement device.

FIG. 29 is a diagram showing the example of the semiconductor measurement device.

FIG. 30 is a diagram showing an example of a reduction projection exposure system including a semiconductor evaluation system.

FIG. 31 is a diagram showing each exposure region of the wafer.

FIG. 32 is a diagram showing the example of a process flow of the semiconductor measurement device.

FIG. 33 is a diagram showing the example of the semiconductor measurement device.

FIG. 34 is a diagram showing an example of an SEM image set used for input.

FIG. 35 is a diagram showing estimation errors found at multiple points.

FIG. 36 is a diagram showing the example of the semiconductor measurement device.

FIG. 37 is a diagram showing the example of a process flow of the semiconductor measurement device.

DESCRIPTION OF EMBODIMENTS

Figure 12:
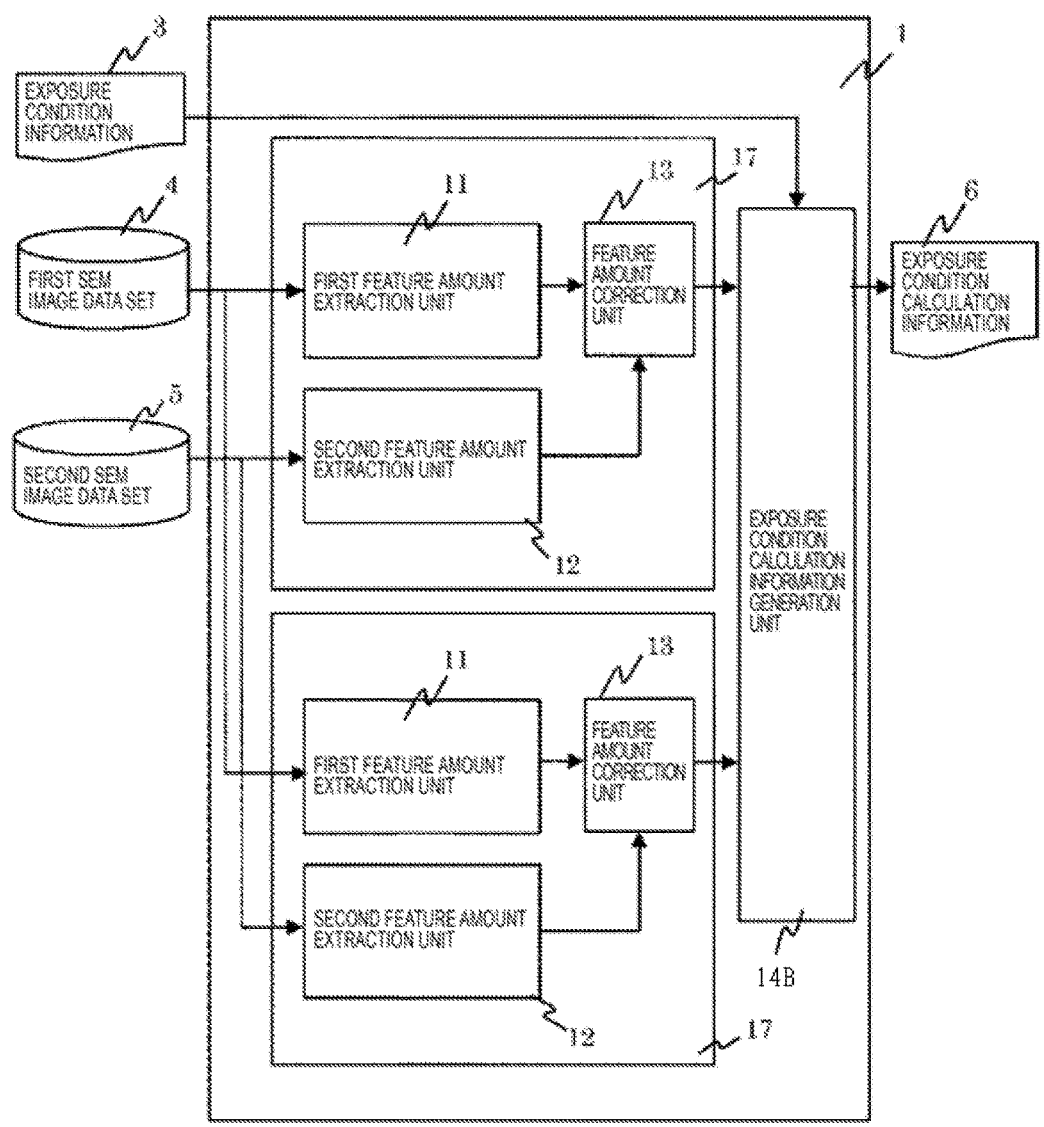
FIG. 12 is a diagram showing the example of the semiconductor measurement device.

An FEM wafer is a conditioning wafer used for finding an exposure condition such as appropriate pattern dimensions or a pattern shape while changing the exposure condition (Focus and Dose) by a reduction projection exposure device. Further, the FEM wafer is also used for correcting exposure condition variation by storing the exposure condition and pattern evaluation information in association with each other. Specifically, the FEM wafer is used for correcting an exposure amount to suppress the deviation thereof by evaluating a pattern by an SEM or the like and comparing the evaluation value thereof with an evaluation value of a pattern that is regarded as the best condition on the FEM wafer.

In this way, an FEM wafer is created in advance in order to evaluate a relationship between an exposure condition and a circuit pattern shape. The pattern shape is evaluated, for example, by extracting features of a pattern from an SEM image (for example, pattern dimensions, two-dimensional shape of a pattern, and the like), and association information between a feature amount and the exposure condition is registered as exposure condition evaluation information. However, actually, there is a possibility that an FEM wafer may be generated with values different from an assumed exposure condition due to roughness on the surface of a resist, non-flatness due to a photomask, aberration of a lens, and the like. Then, deviation of the exposure condition occurring in the FEM wafer becomes a factor of lowering accuracy when obtaining a relationship between the exposure condition and the circuit pattern shape. If there is deviation in the exposure condition in the FEM wafer, a normal relationship between the exposure condition and the circuit pattern shape cannot be obtained. Even if a normal relationship is used, estimated exposure parameters may not be normal in some cases.

In the examples described below, as an example, a pattern measurement device that evaluates a relationship between exposure parameters and a circuit pattern shape which are not affected by roughness or the like on the surface of a resist, and a pattern measurement device that obtains an exposure condition by using the relationship between the exposure parameters and the circuit pattern shape will be described.

Example 1

In the present example, a semiconductor measurement device that obtains an exposure condition of a semiconductor pattern from an image captured by using an electron beam will be described, the semiconductor measurement device including a first feature amount extraction unit that uses a first SEM image data set obtained by capturing images of circuit patterns of a wafer created by changing an exposure condition of a reduction projection exposure device and a second SEM image data set obtained by capturing images of circuit patterns of a wafer created by making exposure conditions uniform to obtain pattern dimensions or shape information from the first SEM image data set, a second feature amount extraction unit that obtains pattern dimensions or shape information from the second SEM image data set, a feature amount correction unit that calculates an output of the first feature amount extraction unit and an output of the second feature amount extraction unit, and an exposure condition calculation information generation unit that generates information for obtaining an exposure condition by using the relationship between the exposure condition corresponding to each SEM image of the first SEM image data set and the output of the feature amount correction unit.

Further, as one aspect for achieving the above purpose, there is provided a semiconductor measurement device that obtains an exposure condition of a semiconductor pattern from an image captured by using an electron beam, the semiconductor measurement device including a feature amount extraction unit that obtains pattern dimensions or shape information from an SEM image data set by using the SEM image data set obtained by capturing an image of a circuit pattern of a wafer, a feature amount correction unit that calculates with an output of the feature amount extraction unit and a feature amount reference value obtained in advance, and an exposure condition calculation unit that obtains an exposure condition by using information using a relationship between the exposure condition and the output of the feature amount correction unit.

According to the above configuration, stable evaluation of an exposure condition can be performed.

The semiconductor measurement device exemplified in the example described below relates to a semiconductor measurement method and a device of a pattern image for monitoring an exposure condition of an exposure device from image data of a circuit pattern obtained by SEM imaging. Further, as a specific example thereof, an example of obtaining a model for detecting a process variation by using feature amounts of pattern shapes from image data of circuit patterns created on two wafers of a wafer created by changing an exposure condition and a wafer created under a uniform exposure condition will be described.

In addition, an example of detecting a process variation by using the feature amount of the pattern shape from the image data will be described.

Hereinafter, a device and a measurement inspection system including a function of detecting a process variation by using a two-dimensional shape of a contour line of a pattern from image data will be described with reference to the drawings. More specifically, a device and a system including a scanning electron microscope for length measurement (Critical Dimension-Scanning Electron Microscope: CD-SEM) which is one type of measurement device will be described.

In the following description, an example in which a charged particle beam device is exemplified as a device that forms an image, and an example using SEM is described as an aspect thereof, but the present invention is not limited thereto. For example, a focused ion beam (FIB) device that forms an image by scanning an ion beam on a sample may be adopted as a charged particle beam device. However, since extremely nigh magnification is required in order to measure a miniaturized pattern with high accuracy, it is desirable to use an SEM that is superior to the FIB device in terms of resolution in general.

FIG. 21 is a schematic explanatory diagram of a measurement and inspection system in which a plurality of measurement or inspection devices are connected to a network. The system mainly includes a CD-SEM 2401 that measures pattern dimensions of a semiconductor wafer, a photomask, and the like, and a defect inspection device 24023 that extracts a defect on the basis of a comparison between an image obtained by irradiating a sample with an electron beam and a reference image registered in advance, which are connected to the network. In addition, on the network, a condition setting device 2403 that sets a measurement position and a measurement condition on the design data of a semiconductor device, a simulator 2404 that simulates the quality of a pattern on the basis of the design data of the semiconductor device and manufacturing conditions of the semiconductor manufacturing device, and a storage medium 2405 that stores design data in which layout data of the semiconductor device and manufacturing conditions are registered are connected to each other.

The design data is expressed in, for example, GDS format, OASIS format or the like, and is stored in a predetermined format. The design data may be of any type as long as the software that displays the design data can display the format thereof and can handle the format as graphic data. In addition, the storage medium 2405 may incorporate a measuring device, a control device of an inspection device, or the condition setting device 2403, the simulator 2404. The CD-SEM 2401 and the defect inspection device 2402 include respective control devices and necessary control is performed for each device, but these control devices may be provided with functions such as the functions of the above simulator or setting the measurement condition or the like.

In the SEM, an electron beam emitted from an electron source is focused by a plurality of lenses, and the focused electron beam is scanned one-dimensionally or two-dimensionally on the sample by a scanning deflector.

A secondary electron (SE) or a backscattered electron (BSE) emitted from, the sample by electron beam, scanning is detected by a detector, and stored in a storage medium such as a frame memory in synchronization with scanning of the scanning deflector. The image signal stored in the frame memory is accumulated by an arithmetic device provided within the control device. In addition, scanning by the scanning deflector is possible for an arbitrary size, position, and direction.

The above-described control and the like are performed by the control device of each SEM. As a result of the electron beam scanning, the obtained image and signal are sent to the condition setting device 2403 via the communication network. In this example, the control device that controls the SEM and the condition setting device 2403 are described separately, but the present invention is not limited thereto. The control and measurement processes of the device may be performed collectively in the condition setting device 2403 or the control and measurement processes of the SEM may be performed together by each control device.

In addition, the condition setting device 2403 or the control device stores a program for executing the measurement process, and measurement or calculation is performed according to the program.

In addition, the condition setting device 2403 includes a function of creating a program (recipe) that controls an operation of the SEM on the basis of the design data of the semiconductor and functions as a recipe setting unit. Specifically, a position and the like for performing a process necessary for the SEM, such as desired measurement points, auto-focus, auto-stigmas, addressing points, and the like on design data, contour line data of a pattern, or simulation-applied design data are set, and on the basis of the settings, a program for automatically controlling a sample stage of the SEM, a deflector, or the like is created. In addition, in order to create a template to be described later, a processor for extracting information on an area to be a template from the design data and creating a template on the basis of the extracted information, or a program for creating a template for a general-purpose processor, is incorporated or stored.

FIG. 22 is a schematic configuration diagram of a scanning electron microscope. An electron beam 2503 drawn from an electron source 2501 by an extraction electrode 2502 and accelerated by an acceleration electrode (not shown) is scanned one-dimensionally or two-dimensionally on a sample 2509 by a scanning deflector 2505 after being narrowed down by a condenser lens 2504 which is one form of focusing lens. The electron beam 2503 is decelerated by a negative voltage applied to an electrode incorporated in a sample table 2508, is focused by the lens action of an objective lens 2506, and is irradiated onto the sample 2509.

When the electron beam 2503 is irradiated to the sample 2509, an electron 2510 such as a secondary electron and a backscattered electron is emitted from the irradiated points. The emitted electron 2510 is accelerated in the direction of the electron source by the acceleration action on the basis of the negative voltage applied to the sample and collides with a conversion electrode 2512 to generate a secondary electron 2511. The secondary electron 2511 emitted from the conversion electrode 2512 is captured by a detector 2513 and an output I of the detector 2513 changes depending on the amount of the captured secondary electron. According to the output I, the luminance of a display device (not shown) changes. For example, in the case of forming a two-dimensional image, an image of a scanning area is formed by synchronizing a deflection signal to the scanning deflector 2505 and the output I of the detector 2513. In addition, in the scanning electron microscope illustrated in FIG. 22, a deflector (not shown) for moving the scanning area of the electron beam is included.

In the example of FIG. 22, an example in which the electron emitted from the sample is detected by being converted at a converting electrode is described, but it is needless to say that the present invention is not limited to such a configuration. For example, it is possible to arrange an electron multiplier tube and a detection surface of the detector on the trajectory of the accelerated electron. A control device 2514 controls each configuration of the scanning electron microscope and includes a function of forming an image on the basis of the detected electron or a function of measuring a pattern width of a pattern formed on the sample on the basis of an intensity distribution of the detected electron, which is called a line profile.

Next, one aspect of an exposure condition calculation information creation unit 1 and an exposure condition calculation unit 2 for performing semiconductor measurement will be described. The exposure condition, calculation information creation unit 1 and the exposure condition calculation unit 2 may be executed in the arithmetic device incorporated in the control device 2514 or in the arithmetic device with an image process incorporated. It is also possible to execute image evaluation by an external arithmetic device (for example, the condition setting device 2403) via a network.

FIG. 30 is a diagram showing an example of an exposure system including an SEM 3000, a reduction projection exposure device 3001, and an exposure condition evaluation device (condition setting device) 3002. The exposure condition evaluation device 3002 exemplified in FIG. 30 includes an arithmetic processing unit 3004 that executes arithmetic process to be described later and a memory 3005 that stores an arithmetic expression necessary for the arithmetic process or a feature amount and an exposure condition obtained as a result of the calculation. In addition, an input/output device 3003 that displays the output of the calculation result or inputs necessary information is provided.

An arithmetic processing unit 301 includes a feature amount extraction unit 3006 that extracts two-dimensional information such as dimensions of a pattern (one-dimensional information) or shape and area of the pattern on the basis of the SEM image. The feature amount extraction unit 3006 extracts inter-peak dimensional information from the signal waveform obtained by the SEM 3000. In addition, in the case of two-dimensional measurement, a contour line is extracted from an edge included in the SEM image, and area and shape information (distortion information and the like) of the contour line is calculated. A feature amount correction unit 3007 corrects the feature amount obtained by the feature amount extraction unit 3006 on the basis of a predetermined condition. As will be described later in detail, the feature amount correction unit 3007 corrects a first feature amount (feature amount of the FEM wafer) of a plurality of patterns formed by a plurality of different exposure condition settings by using a second feature amount (feature amount of a nominal wafer) of a plurality of patterns formed by making the exposure conditions uniform.

A calculation result classification unit 3008 classifies the above-described feature amount and the corrected feature amount according to a predetermined classification condition. Classification is performed in shot units and exposure condition units and is stored in a predetermined format. A model creation unit 3009 creates a model in which an exposure condition of the reduction projection exposure device 3001 and a feature amount of a pattern created under the exposure condition are associated. The model is used for grasping the variation of the feature amount of the pattern and the variation of the exposure condition and is used for grasping an adjustment amount of the exposure condition for correcting the variation of the feature amount, for example. An exposure condition calculation unit 3010 calculates correction parameters of the exposure condition using the model generated by the model creation unit 3009.

FIG. 1 is a diagram for explaining an example of a semiconductor measurement device that creates exposure condition calculation, information for obtaining a relationship between an SEM image and an exposure condition.

The exposure condition calculation information creation unit 1 (exposure condition evaluation device) uses a first SEM image data set 4 and a second SEM image data set 5 as inputs. The first SEM image data set 4 is an image data set obtained by SEM imaging circuit patterns of the FEM wafer created with a plurality of exposure shots while changing Focus and Dose which is an exposure condition as in a wafer A shown in FIG. 9. The second SEM image data set 5 is an image data set obtained by SEM imaging circuit patterns of a wafer (nominal wafer) uniformly created with a plurality of exposure shots without changing the exposure conditions as in a wafer B of FIG. 9.

Exposure condition information 3 is information on an exposure condition corresponding to each image data of the first SEM image data set 4. From the first SEM image data set 4 and the second SEM image data set 5, a feature amount of each circuit pattern image is calculated through a first and a second feature amount calculation units 11 and 12, respectively. A feature amount correction unit 13 corrects the feature amount calculated by the first feature amount calculation unit 11 with the feature amount calculated by the second feature amount calculation unit 12. A calculation information generation unit 14 obtains a relationship between the feature amount and the exposure condition by using the corrected feature amount and the exposure condition information 3 corresponding to the image. The relationship between the obtained feature amount and the exposure condition is output as exposure condition calculation information 6. Here, the first and second feature amount calculation units are used, but it is also conceivable to use one feature amount calculation unit two times. In addition, it is also conceivable to provide a storage unit that stores the feature amounts obtained by the feature amount calculation units in the exposure condition calculation information creation unit 1.

FIG. 2 is a diagram for explaining an example of a semiconductor measurement device that obtains an exposure condition from an SEM image. The exposure condition calculation unit 2 inputs the SEM image data set 5 for which an exposure condition is to be obtained. In addition, the exposure condition calculation unit 2 inputs the exposure condition calculation information 6 obtained by the exposure condition calculation information creation unit 1. The exposure condition calculation information 6 may be stored in advance. The feature amount calculation unit 11 calculates a feature amount of circuit pattern images from a second SEM image data set 5. The feature amount correction unit 13 corrects the feature amount calculated by the feature amount calculation unit 11 by using a previously obtained feature amount reference value. The feature amount reference value will be described separately. A calculation unit 16 calculates exposure condition information 7 by using the exposure condition calculation information 6 which shows the relationship between the corrected feature amount and the exposure condition. Specifically, the exposure condition information 7 is the values of Focus and Dose. FIG. 3 shows an example of a feature amount extraction unit. A contour line extraction unit 111 extracts contour line data from an SEM image data. Then, a shape feature is calculated for the contour line data obtained by a shape feature calculation unit 112.

FIG. 4 shows an example of a contour line extraction unit. For each SEM image of the SEM image data sets 4 and 5, an edge image is obtained by a process of extracting an edge such as a Laplacian filter by an edge detection unit 1111, binarized with an arbitrary threshold value in a binarization unit 1112, and thinned by a thinning unit 1113 to obtain contour line data. In addition, the edge image may be binarized by smoothing a white band and thinned to obtain contour line data, or any other method may be used as long as contour line data whose pattern shape can be recognized is obtained.

FIG. 5 shows an example of a shape feature calculation unit. An alignment unit 1122 aligns the contour line data of the contour line extraction unit 111 and the reference data created by a reference data creation unit 1121. Then, a distance value calculation unit 1123 obtains the distance between pixels corresponding to each pixel in the aligned contour line data and the reference pattern. A statistics amount calculation unit 1124 uses the distance value obtained for each pixel and calculates the statistics thereof and outputs the calculated value as a feature amount.

The reference data created by the reference data creation unit 1121 may be design data, simulation data, image data or contour line data created by averaging one or a plurality of SEM images. In addition, one piece of contour line data among a plurality of contour line data generated by a contour generation unit 11 may be used as a reference pattern or a contour line created by using a plurality of contour lines and averaging the positions of a plurality of corresponding contour pixels may be used as a reference pattern. Further, it is also conceivable to create a reference pattern externally and input from the outside instead of creating here.

The alignment unit 1122, which aligns contour line data and a reference pattern, images the contour line data and the reference pattern, respectively expands, performs a matching process using normalized correlation to align each piece of the contour line data and the reference pattern. In addition, it is also conceivable to align the contour line data and the reference pattern so that the center of gravity positions thereof match by obtaining the center of gravity of the images obtained after the imaging. Without being limited thereto, the contour line data and the reference pattern can be aligned using a known matching technique.

In addition, the distance value calculation unit 1123 associates the pixels of the contour line after the alignment with the pixels of the reference pattern, for example, associates the pixel having the shortest distance among the pixels of the reference pattern as a pixel of the corresponding reference pattern with reference to the pixels of the contour line to obtain the distance between the corresponding pixels.

The statistics amount calculation unit 1124 similarly calculates the distance between the pixels of the contour line and the corresponding pixels of the reference pattern and sets the statistics amount of the distance calculated for all the pixels, for example, an average value or a variance value, degree of distortion, degree of protrusion, and the like as a feature amount. The feature amount may be obtained by a plurality of pixels instead of all the pixels. The association is obtained here with reference to the pixels of the contour line, but may be obtained with reference to the pixels of the reference pattern.

FIG. 6 shows an example of a feature amount correction unit. A subtraction unit 131 of the feature amount correction unit corrects the feature amount obtained by a first feature amount extraction unit 11 by subtracting the feature amount obtained by a second feature amount extraction unit 12 from the feature amount obtained by the first feature amount extraction unit 11.

A selector 134 switches a value to be subtracted between when exposure condition calculation information is created and when the exposure condition is calculated. When exposure condition calculation information is created, the feature amount obtained by the second feature amount extraction unit 12 is selected and when the exposure condition is calculated, the value of a feature amount reference value 133 is selected. The feature amount reference value 133 is obtained when exposure condition calculation information is created and is used when the exposure condition is calculated.

It is conceivable that the feature amount reference value 133 is set as an average of a sum of a plurality of image data values for the value of the feature amount obtained for each image data of the second feature amount extraction unit 12 in an average processing unit 132. In addition, the feature amount reference value 133 may be a value created from the feature amount of the second feature amount extraction unit 12 of one or a plurality of pieces of image data corresponding to a specific position on the wafer. This value is internally stored as the feature amount reference value 133 and is read when the exposure condition is calculated.

FIG. 7 shows an example of a calculation information generation unit. A model indicating the relationship between the corrected feature amount obtained by the feature amount correction unit 13 and the exposure condition information 3 is calculated by a model calculation unit 141 and output as exposure condition calculation information 5. The model may use a plurality of statistic values as the corrected feature amounts and may use a regression equation for obtaining an exposure condition by a linear sum obtained by multiplying respective coefficients.

For example, in the regression equation, an exposure condition Y can be represented by a linear sum of the respective weight coefficients X1, X2, . . . Xn for a plurality of statistic values A1, A2, . . . An.

$$Y = X1A1 + X2A2 + \ldots XnAn + b \qquad \text{Equation 1}$$

In this case, the exposure condition calculation information is a value of the weight coefficients X1, X2, . . . Xn, b of each statistic value. In addition, the value may be obtained by nonlinear regression or a linear planning method may be used. A model may be used by learning by using a plurality of statistic values and the exposure conditions thereof to obtain weights. Further, it is also conceivable to create a library or the like in which the corrected feature amount is associated with the exposure condition information 3 as a model.

FIG. 8 shows an example of the calculation unit 16 used in the exposure condition calculation unit 2. A model arithmetic unit 161 performs calculation using the exposure condition calculation information 6 created by the exposure condition calculation information creation unit 1 and the corrected feature amount obtained by the feature amount correction unit 13. For example, it is conceivable to obtain an exposure condition by corresponding multiplying weights and a plurality of statistic amounts by the arithmetic of the model. It is also conceivable to select the corrected feature amount without performing the calculation as a library in which the exposure condition calculation information 6 is associated with the corrected feature amount.

FIG. 20 shows a cross section and a focal position of a resist during exposure. The resist surface of the wafer has roughness due to uneven coating or the like, and even if the resist is set to the same focal position, if the resist is concave, the resist has an upper focal point and if the resist is convex, the resist has a lower focal point, which may deviate from an appropriate focal position in some cases. In order to obtain the deviation from the SEM image, a model or the like is created by using a wafer created by changing an exposure condition, but since the wafer itself also has deviation, an appropriate model may not be obtained in some cases. For this reason, it is considered to correct a feature amount of the images obtained by SEM imaging circuit patterns of a wafer created by changing an exposure condition in the related art by using a feature amount of the images obtained by SEM imaging circuit patterns of a wafer under a uniform exposure condition.

As shown in FIG. 9, first SEM image data set 4 and second SEM image data set 5 are created by SEM imaging the wafer A created by changing an exposure condition and the wafer B created under a uniform exposure condition, but at that time, the wafer A and the wafer B are imaged at the same wafer position. For example, the wafer A and the wafer B are imaged at the same coordinates x and y by assuming that an SEM image captured at the coordinates x and y of the wafer A is A1 and an SEM image captured at the coordinates x and y of the wafer B is B1.

Similarly, the wafer A and the wafer B need to be SEM imaged at the same coordinates for the SEM image data sets to be used. Even if the same coordinates are used, the coordinates slightly deviate within 10 μm range, but since it is conceivable that the deviation is smaller than the cycle of the roughness on the wafer, it is considered that there is no problem. Uneven resist coating is reproducible, so the roughness is the same for the two wafers at the same coordinates. Therefore, it is considered that it is possible to correct the feature amount of the roughness by subtracting the feature amount of the images of the wafer B created under the uniform exposure condition from the feature amount of the images of the wafer A created by changing the exposure condition. By subtracting the feature amount of the roughness, it is possible to obtain a feature amount which is not affected by the roughness on the wafer, and the model for obtaining the exposure condition created from the feature amount is also a model which is not affected by the roughness on the wafer, in the model, the feature amount of the wafer B is subtracted, but there may be offset values other than the roughness in the feature amount, and in that case, it is necessary to correct the offset values when obtaining an exposure condition using the model.

FIG. 10 shows a process flow of an exposure condition calculation condition generation process. In an SEM imaging process S11, as shown in FIG. 9, the circuit patterns of the wafer A created by changing the exposure condition and the wafer B created under the uniform exposure condition are SEM imaged and the first SEM image data set obtained by SEM imaging the circuit patterns of the wafer A and the second SEM image data set obtained by SEM imaging the circuit patterns of the wafer B are obtained. Subsequently, the feature amount of the first SEM image data set is calculated in a first feature amount calculation process S12, and the feature amount of the second SEM image data set is calculated in a second feature amount calculation process S12. In a feature amount correction process S14, the feature amount calculated in the first feature amount calculation process S12 is corrected with the feature amount calculated in the second feature amount calculation process S12. Then, a relationship between the exposure condition of the wafer A created by changing the exposure condition in a calculation information generation process S15 and the corrected feature amount of the image data corresponding to the exposure condition is obtained and output as exposure condition calculation information.

FIG. 11 shows a process flow of an exposure condition calculation process. In an SEM imaging process S21, circuit patterns of a wafer C for which an exposure condition is to be calculated is SEM imaged to obtain an SEM image data set. Then, in a feature amount calculation process S22, the feature amount of the SEM image data set is calculated. In a feature amount correction process S23, the feature amount calculated in the feature amount calculation process S22 is corrected with a specific value, and in a calculation process S24, the exposure condition is calculated with the exposure condition calculation information and the corrected feature amount.

FIG. 12 is a diagram for explaining an example of the semiconductor measurement device that creates exposure condition calculation information by using a plurality of contour lines. In the exposure condition calculation information creation unit 1, a case where two contour lines are used will be described here. In a case where the first feature amount extraction unit 11 and the second feature amount extraction unit 12 and the feature amount correction unit 13 are combined to form a shape feature extraction unit 17, using two shape feature extraction units 17, a relationship between the corrected feature amounts of the two shape feature extraction units 17 and the exposure condition information 3 is obtained by an exposure condition calculation information generation unit 14B and output as exposure condition calculation information 6.

The number of the shape feature extraction units 17 is increased in accordance with the number of contour lines. In the case of three contour lines, using three shape feature extraction units 17, a relationship between the three corrected feature amounts and the exposure condition information 3 is obtained by the exposure condition calculation information generation unit 14B and output as exposure condition calculation information 6.

FIG. 13 is a diagram for explaining an example of the semiconductor measurement device that calculates an exposure condition by using a plurality of contour lines. Here, a case where two contour lines are used will be described.

In the exposure condition calculation unit 2, in a case where the feature amount extraction unit 11 and the feature amount correction unit 13 are combined to form a shape feature extraction unit 18, using two shape feature extraction units 18, an exposure condition is obtained by the calculation unit 16 by using the corrected feature amounts of the two shape feature extraction units 18 and the exposure condition calculation information 6 and output as exposure condition information 7.

The number of the shape feature extraction units 18 is increased in accordance with the number of contour lines. In the case of three contour lines, using three shape feature extraction units 18, an exposure condition is obtained by the calculation unit 16 by using the three corrected feature amounts and the exposure condition calculation information 6 and output as exposure condition information 7.

FIG. 14(a) shows an example of a GUI of the semiconductor measurement device. When creating information for calculating an exposure condition, for example, when creating a model, it is conceivable that there are an area for activating model creation execution as shown in FIG. 14, and as data to be used, an area A for specifying the first SEM image data set obtained by SEM imaging the circuit patterns of the wafer A created by changing the exposure condition as shown in FIG. 9 and an area B for specifying the second SEM image data set obtained by SEM imaging the circuit patterns of the wafer B created under the uniform exposure condition, and it is possible to make model creation execution possible by specifying two SEM image data sets.

In addition, after model creation execution is performed, as shown in FIG. 14(b), it is conceivable to output exposure condition calculation information of the information for calculating an exposure condition and feature amount reference value information for correcting the feature amount.

In addition, when calculating an exposure condition as shown in FIG. 15, it is conceivable that there are an area for activating calculation process execution, an area C for specifying an image data set to be subjected to exposure condition calculation, an area D for specifying information for calculating the exposure condition, for example, a model expression or a library, and an area E for specifying the feature amount reference value information used for correction of the feature amount, and it is possible to make calculation process execution possible by specifying the image data set and the information.

FIG. 16 shows an example of the semiconductor measurement device. FIG. 16 is mostly the same as FIG. 1 except that the feature amount reference value from a feature amount reference value creation unit 15 is output as feature amount reference value information 8. In addition, FIG. 17 shows an example. FIG. 17 is different from FIG. 2 in that the feature amount reference value information 8 is input to the exposure condition calculation unit 2 and used in the feature amount correction unit 13. In these cases, as shown in FIG. 18, the feature amount correction unit 13 corrects the feature amount by subtracting either one of the feature amount of the feature amount extraction process 12 selected by the selector 134 from the feature amount extraction process 11 in the subtraction unit 131 and the feature amount reference value of the feature amount reference value information 8. Switching by the selector 135 is the same as in FIG. 6, and when exposure condition calculation information is created, the feature amount obtained by the second feature amount extraction unit 12 is selected and when the exposure condition is calculated, the value of the feature amount reference value information 8 is selected. FIG. 19 shows the feature amount reference value creation unit. It is conceivable to set a feature amount reference value as an average of a sum of a plurality of image data values for the value of the feature amount obtained for each image data of the second feature amount extraction unit 12 by an average processing unit 151. In addition, the feature amount reference value 133 may be a value created from the feature amount of the second feature amount extraction unit of one or a plurality of pieces of image data corresponding to a specific position on the wafer. The created value is output as feature amount reference value information 8.

It is also conceivable to perform the above-described process by a software process using a personal computer. In addition, it is conceivable to put the process into an LSI.

Example 2

In Example 1, an example in which exposure condition calculation information is obtained mainly on the basis of correction of a feature amount is described, but in the present example, an example in which exposure condition calculation information is obtained mainly by correcting an exposure condition will be described. As a specific aspect of the embodiment for achieving the above purpose, there is provided an exposure condition evaluation device that creates association information between a first feature amount of a plurality of patterns formed by a plurality of different first exposure condition settings and an exposure condition of the plurality of patterns, calculates a second exposure condition on the basis of the association information and a second feature amount of a plurality of patterns formed by making exposure conditions uniform, and corrects the first exposure condition by using the calculated second exposure condition.

FIG. 23 shows an example of a process flow of the semiconductor measurement device. In a first feature amount calculation process S32, a feature amount is obtained from the SEM image data set 4 obtained by SEM imaging the circuit patterns of the FEM wafer created under a plurality of exposure conditions while changing Focus and Dose which is the first exposure condition. In a calculation information generation process S33, calculation information (association information of the feature amount and the exposure condition) for obtaining an exposure condition is created on the basis of the obtained feature amount, and the exposure conditions corresponding thereto (Focus and Dose).

Then, in a second feature amount calculation process S34, a feature amount is obtained from the SEM image data set 5 obtained by SEM imaging the circuit patterns of the wafer uniformly created under a plurality of exposure conditions without changing the exposure conditions and in a calculation process S35, an exposure condition is obtained on the basis of the feature amount by using the calculation information for obtaining an exposure condition to be obtained in the calculation information generation process S33.

Then, in an exposure condition correction process S36, the exposure condition of the first SEM image data set 4 is corrected by using the obtained exposure condition. The exposure condition correction process S36 is a process in which difference (deviation of the exposure condition) between the exposure condition corresponding to the SEM image data set 5 and the value of the exposure condition calculated in the calculation processing S35 on the basis of the feature amount of the second feature amount calculation process is obtained and the deviation of the exposure condition is added to the exposure condition. (Focus and Dose) corresponding to a first feature amount.

Then, in a calculation information generation process S37, calculation information for obtaining an exposure condition is created again by using the corrected exposure condition and the feature amount of the first SEM image data set 4. Therefore, it is possible to create calculation information for obtaining an exposure condition in a state in which there is no deviation of the exposure condition and obtain an exposure condition with high accuracy.

In addition, as shown in FIG. 24, after calculation information for obtaining an exposure condition is created in the calculation information generation process S37, it is conceivable to further obtain an exposure condition in the calculation process S35 by using the feature amount and the calculation information obtained in the second feature amount calculation process S34 and repeat S35 to S39 a plurality of times until n becomes m. By repeating the processes, it is considered that an exposure condition with higher accuracy can be obtained.

In addition, as shown in FIG. 25, as for the calculation information generation process, in a second feature amount calculation process S52, a feature amount is obtained from the SEM image data set 5 in advance, in a valid feature amount determination process S53, it is determined whether or not the obtained feature amount is equal to or less than a specific value and the position of the wafer at which the feature amount is less than or equal to the specific value is stored, and in a first feature amount calculation process S54, a feature amount is obtained from, the SEM image data set 4 of the circuit pattern of a first FEM wafer only for the exposure condition corresponding to the stored wafer position or the position of the wafer. Then, in the calculation information generation processing S55, calculation information for obtaining an exposure condition is obtained by using the obtained feature amount. It is considered that it is possible to use only the feature amount of the SEM image data set 4 that is valid for creating calculation information for obtaining an exposure condition by obtaining a point where the deviation from the exposure condition is large from the SEM image data set 5 in advance and excluding the portion thereof, thereby contributing to improvement of accuracy of the calculation information. This process corresponds to the processes up to S33 of FIG. 24. The subsequent process will continue from, for example, S34 of FIG. 24. Since the deviation of the exposure condition is corrected after the exposure condition correction process S36, in the calculation information generation process, it is conceivable to obtain calculation information of the exposure condition by using the position of the wafer determined not to be valid or the feature amount corresponding to the exposure condition corresponding to the position of the wafer.

In a case where the exposure condition is calculated after exposure condition calculation information is created in the exposure condition calculation information generation process, as shown in FIG. 26, the feature amount is calculated from the SEM image in a feature amount calculation process S62, and the exposure condition is calculated by using the exposure condition calculation information in a calculation process S63. The feature amount calculation process S62 is the same process as S32 and S34 of FIG. 24. In addition, the calculation process S63 is also the same process as S35 of FIG. 24.

FIG. 27 is a diagram for explaining an example of a semiconductor measurement device that creates exposure condition calculation information for obtaining a relationship between an SEM image and an exposure condition. The exposure condition calculation information creation unit 1 uses the first SEM image data set 4 and the second SEM image data set 5 as inputs. The first SEM image data set 4 is an image data set obtained by SEM imaging circuit patterns of the FEM wafer created with a plurality of exposure shots while changing Focus and Dose which is an exposure condition as in a wafer A shown in FIG. 9. The second SEM image data set 5 is an image data set obtained by SEM imaging circuit patterns of a wafer uniformly created with a plurality of exposure shots without changing the exposure conditions as in the wafer B of FIG. 9. Exposure condition information 3 is information on an exposure condition corresponding to each image data of the first. SEM image data set 4.

From the first SEM image data set 4 and the second SEM image data set 5, a feature amount of each circuit pattern image is calculated through a first and a second feature amount calculation units 11 and 12, respectively. The calculation information generation unit 14 obtains the relationship between the feature amount and the exposure condition by using the feature amount obtained in the first feature amount calculation unit 11 and the exposure condition information 3 corresponding to the image. The relationship between the obtained feature amount and the exposure condition is output as exposure condition calculation information 6 to the calculation unit 16. The calculation unit 16 obtains an exposure condition by using the feature amount obtained in the second feature amount extraction unit 12 and the exposure condition calculation information obtained in the calculation information generation unit 14 and further obtains the difference between the obtained exposure condition and the exposure condition corresponding to the second SEM image data set as exposure condition deviation. Since the exposure condition corresponding to the second SEM image data set is a uniform and known value, the deviation of the exposure condition is obtained by subtracting the known value from the value of the obtained exposure condition. Using the obtained deviation of the exposure condition, an exposure condition correction unit 10 corrects the exposure condition by adding the exposure condition to the value of the exposure condition of the exposure condition information 3. Then, the relationship between the feature amount and the exposure condition is obtained again by using the exposure condition corrected by the exposure condition correction unit 10 and the feature amount obtained by the first feature amount calculation unit 11. The relationship between the obtained feature amount and the exposure condition is output as exposure condition calculation information 6.

Further, it is also conceivable to repeat the above process a plurality of times by obtaining the deviation of the exposure condition in the calculation unit 16 by using the exposure condition calculation information 6. When obtaining an exposure condition from an SEM image, as shown in FIG. 28, the feature amount is extracted from an SEM image data set by the feature amount extraction unit 11, the exposure condition is calculated by using the pre-created exposure condition calculation information 6 by the calculation unit 16 and output as exposure condition information 7.

FIG. 29 is a diagram for explaining an example of a semiconductor measurement device that creates exposure condition calculation information for determining whether or not the feature amount obtained from the first SEM image data set 4 is valid data by using the second SEM image data set 5. A feature amount is obtained in the second feature amount calculation process S52, a valid feature amount determination unit 19 determines whether or not the obtained feature amount is equal to or less than a specific value by using the second SEM image data set 5 in advance, and the position of the wafer at which the feature amount is less than or equal to the specific value is stored. Then, a feature amount is obtained from the SEM image data set 4 of the circuit patterns of the first FEM wafer, and when obtaining a relationship between the feature amount and the exposure condition in the calculation information generation unit 14, the relationship is obtained by using only the feature amount corresponding to the exposure condition corresponding to the position of the stored wafer or the position of the wafer. Then, the relationship between the feature amount and the exposure condition is obtained as exposure condition calculation information 6, similarly as in FIG. 28, the exposure condition is calculated in the calculation unit 16 by using the second SEM image data set 5, and the deviation of the obtained exposure condition is further obtained to correct the exposure condition. When obtaining the relationship between the feature amount and the exposure condition again in the calculation information generation unit 14 by using the feature amount obtained from the first SEM image data set 4 by using the corrected exposure condition, the relationship between the feature quantity and the exposure condition is obtained by using not only the feature amount determined by the valid feature amount determination unit but also the feature amount determined not to be valid and output as exposure condition calculation information 6.

Further, similarly, an example of obtaining exposure condition calculation information by correcting the exposure condition by obtaining the exposure condition deviation will be described. As a specific aspect of the embodiment for achieving the purpose, there is provided an exposure condition evaluation device that estimates exposure condition deviation by using a first feature amount of a plurality of patterns formed by a plurality of different first exposure condition settings and a second feature amount of a plurality of patterns formed by making setting exposure conditions uniform and corrects the first exposure condition.

A wafer will be described with reference to the drawing of FIG. 31 in which numbers are assigned to areas divided into squares for each exposure. The linear regression for obtaining a focus value when using the feature amount of the wafer A formed by a plurality of different first exposure condition settings can be represented by the following expression A, assuming that setting values of the focus of areas (11 to 77) exposed on the wafer are F(1 to 7), calculated feature amounts are A(1 to M), weights of the feature amounts are X(1 to m), exposure condition deviation of the areas (11 to 77) of the wafer is o(11 to 77), and difference between setting values of the exposure conditions of focus obtained by adding the exposure condition deviation o(11 to 77) to each area of the wafer A and the estimation values of the exposure condition is residuals εA(11 to 77).

$$F1 + o11 = X1A1(11) + X2A2(11) + \ldots + XmAm(11) + \varepsilon A(11)$$
$$F2 + o12 = X1A1(12) + X2A2(12) + \ldots + XmAm(13) + \varepsilon A(12)$$
$$F3 + o13 = X1A1(13) + X2A2(13) + \ldots + XmAm(13) + \varepsilon A(13)$$
$$\vdots$$
$$F7 + o77 = X1A1(77) + X2A2(77) + + XmAm(77) + \varepsilon A(77)$$

In the wafer A, the setting values of the focus F(1 to 7), the calculated feature amount A(1 to m), and the exposure condition deviation o(11 to 77) of the wafer area change in each area (11 to 77).

A linear regression equation for obtaining focus values when using the feature amount of the wafer B formed by making the exposure conditions uniform can be similarly represented by the following equation B. However, in the wafer B, the focus values are the same setting value in the entire area. In addition, the weights X(1 to m) of the feature amounts and the exposure condition deviation o(11 to 77) of the areas of the wafer are the same values as those of the wafer A.

$$F4 + o11 = X1B1(11) + X2B2(11) + \ldots + XmBm(11) + \varepsilon B(11)$$
$$F4 + o12 = X1B1(12) + X2B2(12) + \ldots + XmBm(13) + \varepsilon B(12)$$
$$F4 + o13 = X1B1(13) + X2B2(13) + \ldots + XmBm(13) + \varepsilon B(13)$$
$$\vdots$$
$$F4 + o77 = X1B1(77) + X2B2(77) + \ldots + XmBm(77) + \varepsilon B(77)$$

These expressions are combined to obtain linear regression, and the exposure condition deviation o11 to o77 where both the residual εA and the residual εB in each area are minimized is obtained as true values of the exposure condition deviation o11 to o77. Then, exposure condition calculation information 6 excluding the obtained exposure condition deviation is obtained.

FIG. 32 shows an example of a process flow of the semiconductor measurement device. In a first feature amount calculation process S72, a feature amount is obtained from the SEM image data set 4 obtained by SEM imaging the circuit patterns of the FEM wafer created under a plurality of exposure conditions while changing Focus and Dose which is the first exposure condition. Then, in a second feature amount calculation process S74, a feature amount is obtained from the SEM image data set 5 obtained by SEM imaging the circuit patterns of the wafer uniformly created under a plurality of exposure conditions without changing the exposure conditions. In a first exposure condition correction process S75, the exposure condition of the exposure condition information 3 is output as it is because there is no value of the exposure deviation, in a calculation information generation process S76, a correspondence relationship with the exposure condition corrected in the exposure condition correction process S75 is obtained by using the feature amount calculated in the first feature amount calculation process S72 and the feature amount calculated in the second feature amount calculation process S74, and the calculation information for obtaining an exposure condition is generated. It is conceivable to obtain an exposure condition by the linear regression using Equations A and B shown above. Information of the weights X (1 to m) of the feature amounts used in Expression A and Expression B is generated as calculation information.

In an exposure deviation calculation process S77, the exposure condition is estimated in each area by using the calculation information generated in the calculation information generation process S76 and the feature amount obtained from, the SEM image data sets 4 and 5, the difference (error) between the estimated exposure condition and the value of the exposure condition corrected in the exposure condition correction process S75 is obtained, and the errors obtained in the same area corresponding to the wafer A and the wafer B are averaged and obtained as exposure condition deviation in that area. For example, in a case where the respective errors obtained, in the area No11 of the wafer A and the area No11 of the wafer B in FIG. 31 are 1.2 nm and −2.4 nm, on average, the value of the exposure deviation of the area No11 is −0.6 nm.

Then, in the calculation information generation process S76, calculation information for obtaining an exposure condition is generated by adding the exposure condition deviation obtained in the exposure deviation calculation process S77 to the setting value of the exposure condition for each area in the exposure condition correction process S75. This process is repeated m times, and the exposure condition deviation at which the error becomes the smallest is obtained in a calculation information determination process S79. Then, calculation information of the exposure condition corresponding to the obtained exposure condition deviation is output.

Further, besides this method, it is conceivable to obtain the value of the exposure condition deviation at which the difference (errors: residuals εA and εB) between the estimated value of the exposure condition and the value including the exposure condition deviation in the setting value of the exposure condition becomes the smallest while setting the exposure condition deviation of all areas globally in Expression A and Expression B in the range of magnitude in which exposure condition deviation occurs in all areas of the wafer A and the wafer B. In addition, means for searching a minimum value such as linear programming, hill climbing method, multi-point searching method such as genetic algorithm, and the like can be used.

FIG. 33 is a diagram for explaining an example of a semiconductor measurement device that creates exposure condition calculation information for obtaining a relationship between an SEM image and an exposure condition. The exposure condition calculation information creation unit 1 uses the first SEM image data set 4 and the second SEM image data set 5 as inputs. The first SEM image data set 4 is an image data set obtained by SEM imaging circuit patterns of the FEM wafer created with a plurality of exposure shots while changing Focus and Dose which is an exposure condition as in a wafer A shown in FIG. 9. The second SEM image data set 5 is an image data set obtained by SEM imaging circuit patterns of a wafer uniformly created with a plurality of exposure shots without changing the exposure conditions as in the wafer B of FIG. 9. Exposure condition information 3 is information on an exposure condition corresponding to each image data of the first SEM image data set 4.

From the first SEM image data set 4 and the second SEM image data set 5, a feature amount of each circuit pattern image is calculated through a first and a second feature amount calculation units 11 and 12, respectively. The calculation information generation unit 14 obtains a relationship between the feature amount obtained by the first feature amount calculation unit 11 and the second feature amount calculation unit 12 and the exposure condition obtained by correcting the exposure condition deviation by the exposure condition deviation estimating unit 9 for the exposure condition information 3 corresponding to the image of the first SEM image data set. The exposure condition deviation estimation unit 9 estimates the exposure condition deviation on the basis of the calculation information of the exposure condition obtained by the calculation information generating unit 14 and the feature amount and the exposure condition information 3 extracted by the first and second feature amount extraction units 11 and 12. The difference (error) between the estimated value of the exposure condition and the value obtained by adding the exposure condition deviation to the exposure condition of the exposure condition information 3 is obtained in each area and the errors obtained in the same areas of the wafer A and the wafer B, and the first SEM image data set 4 and the second SEM image data set 5 are averaged to obtain a value as the exposure condition deviation in that area. Then, a value obtained by adding the exposure condition deviation to the setting value of the exposure condition for each area is passed to the calculation information generation unit 14. Then, the calculation information generation unit 14 obtains the calculation information of the exposure condition and similarly estimates the exposure condition deviation by using the calculation information of the obtained exposure condition. This process is repeated m times, and the exposure condition deviation at which the error is the smallest is obtained. Then, the calculation information generation unit 14 outputs the calculation information of the exposure condition generated with the exposure condition deviation at which the error becomes the smallest as exposure condition calculation information 6.

Example 3

In Examples 1 and 2, an example in which exposure condition calculation information is obtained by using two first and second SEM image data sets from two wafers is described, but in the present example, an example will be described in which one exposure wafer formed by a plurality of different exposure condition settings is used, the exposure condition is corrected by obtaining exposure condition deviation, and exposure condition calculation information is obtained. As a specific aspect of the embodiment for achieving the purpose, there is provided an exposure condition evaluation device that estimates exposure condition deviation by using the feature amount of a plurality of patterns formed by a plurality of different exposure condition settings and corrects the exposure condition.

In the present example, as shown in FIG. 34, a plurality of points (nine points in this case) of respective neighboring patterns are used. Then, a plurality of patterns corresponding to a plurality of different exposure conditions are used. In a case where exposure deviation does not occur in the area of each exposure of the wafer, when exposure condition calculation information is obtained at each of a plurality of points and the difference (estimation error) between the estimated value of the exposure condition and a setting value is obtained, the error is shifted plus or minus 0 and approaches 0 when averaged as shown in the graph on the right side of FIG. 35. On the contrary, exposure deviation occurs in the area of each exposure of the wafer, as shown in the graph on the left side of FIG. 35, the error is shifted plus or minus around the value of the exposure deviation and approaches the value of the exposure deviation when averaged. Therefore, the exposure condition is estimated for each exposure area by obtaining exposure condition calculation information from a plurality of neighboring patterns and those estimation errors are obtained and averaged, and it is possible to calculate a value of the exposure deviation for each exposure area. If the value of the exposure deviation is determined, it is possible to obtain the exposure condition calculation information without the influence of the exposure deviation by correcting the value and obtaining the exposure condition calculation information again.

FIG. 36 is a diagram, for explaining an example of a semiconductor measurement device that creates exposure condition calculation information for obtaining a relationship between an SEM image and an exposure condition. The exposure condition calculation information creation unit 1 uses the SEM image data set 4 as an input. The SEM image data, set 4 is an image data set obtained by SEM imaging the circuit patterns of the FEM wafer created with a plurality of exposure shots while changing Focus and Dose which is an exposure condition as in the wafer A shown in FIG. 9. The exposure condition information 3 is information on an exposure condition corresponding to each image data of the SEM image data set 4.

The feature amount of each circuit pattern image is calculated from the SEM image data set 4 through the feature amount calculation unit 11. The calculation information generation unit 14 obtains the relationship between the feature amount and the exposure condition by using the feature amount obtained by the feature amount calculation unit 11 and the exposure condition information 3 corresponding to the image. Then, the exposure condition is estimated for each exposure area on the basis of the relationship between the feature amount and the exposure condition obtained by the exposure deviation calculation unit 20 and the feature amount extracted by the feature amount calculation unit 11, and a difference (error) between the estimated exposure condition and the exposure condition of the exposure condition information is obtained. Then, after repeatedly obtaining errors of a pattern of a plurality of points for the neighboring patterns of a plurality of points, the errors are averaged for each exposure area and obtained as a value of exposure deviation. Then, the exposure condition is corrected by adding the exposure condition and the value of the exposure deviation of the exposure condition information.

A calculation information generation unit 21 obtains a relationship between the feature amount and the exposure condition on the basis of the corrected exposure condition and the feature amount extracted by the feature amount calculation unit 11 and outputs the obtained value as exposure condition calculation information 6. In the calculation information generation unit 21, it is conceivable to obtain the relationship between the feature amount and the exposure condition by linear regression.

FIG. 37 shows an example of a process flow of the semiconductor measurement device. In a feature amount calculation process S82, a feature amount is obtained from, the SEM image data set 4 obtained by SEM imaging the circuit patterns of the FEM wafer created under a plurality of exposure conditions while changing Focus and Dose which is the first exposure condition. Then, in a calculation information generation process S83, calculation information (association information of the feature amount and the exposure conditions) for obtaining an exposure condition is created on the basis of the obtained feature amount and the exposure condition corresponding thereto (Focus and Dose).

Then, in an estimated error calculation process S84, the exposure condition, is estimated for each exposure area from, the feature amount of the SEM image data set 4 obtained by SEM imaging by using the calculation information (association information of the feature amount and the exposure condition) created in the calculation information generation process S83 and the difference (estimation error) between, the estimated exposure condition and the exposure condition (Focus and Dose) is calculated.

Then, similar calculation is repeated for m points of the image data set of the neighboring patterns, and an estimation error is obtained at respective m points. In an exposure deviation calculation process S86, the m estimation errors obtained for each exposure area are averaged and calculated as a value of exposure deviation. In an exposure condition correction process S87, the exposure condition is correct by adding the value of the obtained exposure deviation to the exposure condition (Focus and Dose) of the corresponding exposure area. In a calculation information generation process S88, exposure condition calculation information 6 (association information between the feature amount and the exposure condition) for obtaining an exposure condition from the corrected exposure condition (Focus and Dose) and the feature amount obtained from the SEM image data set 4 is created.

REFERENCE SIGNS LIST 1 exposure condition calculation information creation unit
2 exposure condition calculation unit
3 exposure condition information
4 first SEM image data set
5 second SEM image data set
6 exposure condition calculation information
7 exposure condition information
8 feature amount reference value information
11 first feature amount extraction unit
12 second feature amount extraction unit
13 feature amount correction unit
14 calculation information generation unit
15 feature amount reference value creation unit
16 calculation unit
17 shape feature extraction unit
18 shape feature extraction unit
111 contour line extraction unit
112 shape feature calculation unit
131 subtraction unit
132 average processing unit
133 feature amount reference value
134 selector
141 model calculation unit
161 model arithmetic unit

The invention claimed is:

1. An exposure condition evaluation device comprising:
an arithmetic device that evaluates an exposure condition of a reduction projection exposure device, on the basis of information of patterns exposed on a sample by the reduction projection exposure device, wherein
the arithmetic device corrects a first feature amount of a plurality of patterns formed on a first wafer by a plurality of different exposure condition settings by using a second feature amount of a plurality of patterns formed on a second wafer under a uniform exposure condition, and
the first feature amount and the second feature amount are based on image information that are captured at same positional coordinates of the exposure condition evaluation device.

2. The exposure condition evaluation device according to claim 1, wherein the arithmetic device generates association information between the corrected first feature amount and exposure condition information, on the basis of the corrected first feature amount and the corresponding exposure condition information.

3. The exposure condition evaluation device according to claim 2,
wherein the arithmetic device calculates an exposure condition, on the basis of the generated association information.

4. The exposure condition evaluation device according to claim 1,
wherein the arithmetic device subtracts the second feature amount from the first feature amount to correct the first feature amount.

5. The exposure condition evaluation device according to claim 1,
wherein arithmetic device corrects a plurality of first feature amounts of a plurality of patterns formed by a plurality of different exposure condition settings by using the second feature amounts of patterns having the same coordinates as the plurality of patterns.

6. The exposure condition evaluation device according to claim 1,
wherein the first feature amount and the second feature amount are at least one of dimensional information and shape information of a pattern formed on the sample.

7. The exposure condition evaluation device according to claim 1,
wherein the arithmetic device extracts a contour line from an edge of a pattern included in an electron microscope image and calculates the first feature amount and the second feature amount, on the basis of the extraction of the contour line.

8. The exposure condition evaluation device according to claim 1,
wherein the arithmetic device generates a model or a library for obtaining an exposure condition, on the basis of the corrected first feature amount and exposure condition information.

9. An exposure condition evaluation device comprising:
an arithmetic device that evaluates an exposure condition of a reduction projection exposure device, on the basis of information of patterns exposed on a sample by the reduction projection exposure device, wherein
the arithmetic device creates association information between a first feature amount of a plurality of patterns formed on a first wafer by a plurality of different first exposure condition settings and the exposure conditions of the plurality of patterns, calculates a second exposure condition on the basis of the association information and a second feature amount of a plurality of patterns formed on a second wafer under a uniform exposure condition, and corrects the first exposure condition by using the calculated second exposure condition, and
the first feature amount and the second feature amount are based on image information that are captured at same positional coordinates of the exposure condition evaluation device.

10. The exposure condition evaluation device according to claim 9,
wherein the arithmetic device corrects the first exposure condition by adding the second exposure condition to the first exposure condition.

11. The exposure condition evaluation device according to claim 9,
wherein the arithmetic device generates association information between the corrected first feature amount and the exposure condition information, on the basis of the corrected first exposure condition and the corresponding exposure condition information.

12. The exposure condition evaluation device according to claim 11,
wherein the arithmetic device calculates an exposure condition, on the basis of the generated association information.

13. The exposure condition evaluation device according to claim 9,
wherein the arithmetic device repeats the correction of the first exposure condition a predetermined number of times.

14. The exposure condition evaluation device according to claim 9,
wherein the arithmetic device corrects the first exposure condition, on the basis of a plurality of first feature amounts of a plurality of patterns formed by a plurality of different exposure condition settings and the second feature amounts of patterns having the same coordinates as the plurality of patterns.

15. The exposure condition evaluation device according to claim 9,
wherein the first feature amount and the second feature amount are at least one of dimensional information and shape information of a pattern formed on the sample.

16. A reduction projection exposure system comprising:
a reduction projection exposure device;
a measurement device that measures a pattern formed on a sample exposed by the reduction projection exposure device; and
an exposure condition evaluation device that evaluates an exposure condition of the reduction projection exposure device, on the basis of pattern information obtained by the measurement device, wherein
the exposure condition evaluation device corrects a first feature amount of a plurality of patterns formed on a first wafer by a plurality of different exposure condition settings by using a second feature amount of a plurality of patterns formed on a second wafer under a uniform exposure condition, and
the first feature amount and the second feature amount are based on image information that are captured at same positional coordinates of the exposure condition evaluation device.

17. A reduction projection exposure system comprising:
a reduction projection exposure device;
a measurement device that measures a pattern formed on a sample exposed by the reduction projection exposure device; and
an exposure condition evaluation device that evaluates an exposure condition of the reduction projection exposure device, on the basis of pattern information obtained by the measurement device, wherein
the exposure condition evaluation device creates association information between a first feature amount of a plurality of patterns formed on a first wafer by a plurality of different first exposure condition settings and the exposure conditions of the plurality of patterns, calculates a second exposure condition on the basis of the association information and a second feature amount of a plurality of patterns formed on a second wafer under a uniform exposure condition, and corrects the first exposure condition by using the calculated second exposure condition, and the first feature amount and the second feature amount are based on image information that are captured at same positional coordinates of the exposure condition evaluation device.

18. An exposure condition evaluation device comprising:

an arithmetic device that evaluates an exposure condition of a reduction projection exposure device, on the basis of information of patterns exposed on a sample by the reduction projection exposure device, wherein the arithmetic device creates association information with an exposure condition of a plurality of patterns and corrects first and second exposure conditions by using the association information, on the basis of a first feature amount of a plurality of patterns formed on a first wafer by a plurality of different first exposure condition settings and a second feature amount of a plurality of patterns formed on a second wafer under a uniform exposure condition, and the first feature amount and the second feature amount are based on image information that are captured at same positional coordinates of the exposure condition evaluation device.

\* \* \* \* \*